(12) United States Patent
Kozuma

(10) Patent No.: US 9,055,245 B2
(45) Date of Patent: Jun. 9, 2015

(54) PHOTODETECTOR INCLUDING DIFFERENCE DATA GENERATION CIRCUIT AND DATA INPUT SELECTION CIRCUIT

(71) Applicant: Semiconductor Energy Laboratory Co., Ltd., Atsugi-shi, Kanagawa-ken (JP)

(72) Inventor: Munehiro Kozuma, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 200 days.

(21) Appl. No.: 13/623,912

(22) Filed: Sep. 21, 2012

(65) Prior Publication Data

US 2013/0075594 A1 Mar. 28, 2013

(30) Foreign Application Priority Data

Sep. 22, 2011 (JP) ................. 2011-206899

(51) Int. Cl.
| | |
|---|---|
| *H01J 40/14* | (2006.01) |
| *H04N 5/357* | (2011.01) |
| *H03F 3/08* | (2006.01) |
| *G01J 1/46* | (2006.01) |

(Continued)

(52) U.S. Cl.
CPC ............. *H04N 5/357* (2013.01); *H03F 3/08* (2013.01); *G01J 1/46* (2013.01); *H04N 5/3745* (2013.01); *H04N 5/378* (2013.01)

(58) Field of Classification Search
CPC ........ H04N 3/357; H04N 3/378; H04N 5/374

USPC ............... 250/214 R, 214.1, 214 A, 214 LA; 327/514, 58–89; 257/290–294
See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 6,294,274 B1 | 9/2001 | Kawazoe et al. | |

(Continued)

FOREIGN PATENT DOCUMENTS

| | | |
|---|---|---|
| CN | 1239308 | 12/1999 |
| CN | 1387264 | 12/2002 |

(Continued)

OTHER PUBLICATIONS

International Search Report (Application No. PCT/JP2012/073768) Dated Oct. 23, 2012.

(Continued)

*Primary Examiner* — Que T Le
(74) *Attorney, Agent, or Firm* — Eric J. Robinson; Robinson Intellectual Property Law Office, P.C.

(57) ABSTRACT

Adverse effects of noise are reduced. A photodetector circuit, a difference data generation circuit, and a data input selection circuit are included. The photodetector circuit has a function of generating an optical data signal. A first data signal and a second data signal is input to the difference data generation circuit and the difference data generation circuit has a function of generating difference data of data of the first data signal and data of the second data signal. The data input selection circuit has a function of determining that the data of optical data signal is regarded as data of the first data signal or data of the second data signal.

8 Claims, 9 Drawing Sheets

(51) Int. Cl.
*H04N 5/3745* (2011.01)
*H04N 5/378* (2011.01)

(56) References Cited

U.S. PATENT DOCUMENTS

| | | |
|---|---|---|
| 6,476,864 B1 | 11/2002 | Borg et al. |
| 6,563,174 B2 | 5/2003 | Kawasaki et al. |
| 6,727,522 B1 | 4/2004 | Kawasaki et al. |
| 6,737,893 B2* | 5/2004 | Taguchi et al. ............... 327/77 |
| 6,855,937 B2 | 2/2005 | Tashiro et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,129,500 B2 | 10/2006 | Tashiro et al. |
| 7,154,075 B2 | 12/2006 | Krymski |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,319,218 B2 | 1/2008 | Krymski |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,772,536 B2 | 8/2010 | Yamada et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2002/0190215 A1 | 12/2002 | Tashiro et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0018065 A1 | 1/2005 | Tashiro et al. |
| 2005/0103977 A1 | 5/2005 | Krymski |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0285544 A1 | 12/2007 | Yamada et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0278652 A1 | 11/2011 | Shima |

FOREIGN PATENT DOCUMENTS

| | | |
|---|---|---|
| CN | 1764244 | 4/2006 |
| CN | 1902903 | 1/2007 |
| EP | 0957630 A | 11/1999 |
| EP | 1259066 A | 11/2002 |
| EP | 1737044 A | 12/2006 |
| EP | 2226847 A | 9/2010 |
| EP | 2242248 A | 10/2010 |
| EP | 2479983 A | 7/2012 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 10-304133 A | 11/1998 |
| JP | 11-505377 | 5/1999 |
| JP | 11-355670 A | 12/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2002-330351 A | 11/2002 |
| JP | 2002-344809 A | 11/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-038908 A | 2/2005 |
| JP | 2007-074435 A | 3/2007 |
| JP | 2007-104186 A | 4/2007 |
| JP | 2007-515869 | 6/2007 |
| JP | 2007-329722 A | 12/2007 |
| JP | 2008-035395 A | 2/2008 |
| JP | 2008-236492 A | 10/2008 |
| JP | 2010-034813 A | 2/2010 |
| JP | 2010-166361 A | 7/2010 |
| JP | 2010-187230 A | 8/2010 |

(56) References Cited

FOREIGN PATENT DOCUMENTS

| JP | 2011-024222 A | 2/2011 |
|---|---|---|
| KR | 10-0817836 B | 3/2008 |
| WO | WO-2004/114391 | 12/2004 |
| WO | WO-2005/050977 | 6/2005 |
| WO | WO-2010/092809 | 8/2010 |

OTHER PUBLICATIONS

Written Opinion (Application No. PCT/JP2012/073768) Dated Oct. 23, 2012.

Aizawa.K et al., "A Novel Image Sensor for On-Sensor-Compression,", The Journal of Institute of Television Engineers of Japan, Feb. 20, 1996, vol. 50, No. 2, pp. 257-265.

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the $In_2O_3$—$Ga_2ZnO_4$—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)m$ (m=3, 4, and 5), $InGaO_3(ZnO)3$, and $Ga_2O_3(ZnO)m$ (m=7, 8, 9, and 16) in the $In_2O_3$—$ZnGa_2O_4$—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation with Ultraviolet Lamp,", Journal of Sol-Gel Science Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)5$ films,", Appl. Phys. Lett. (Applied Physics Letters), Sep. 13, 2004, vol. 85, No. 11, pp. 1993-1995.

Li.C et al., "Modulated Structures of Homologous Compounds $InMO_3(ZnO)m$ (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

(56) References Cited

OTHER PUBLICATIONS

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Sympoisum Digest of Tehnical Papers, May 31, 2009, pp. 395-398.

Lee.H et al., "Current Status of, Challenges to, and Perspective View of AM-OLED,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YbFe2O4, andYb2Fe3O7 Types of Structures for Compounds in the In2O3 and Sc2O3—A2O3—Bo Systems [A; Fe, Ga, or Al; B: Mg, Mn, Fe, Ni, Cu,or Zn] at Temperatures over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

\* cited by examiner

D_PD=DA

D_PD=DB

PHOTODETECTOR INCLUDING DIFFERENCE DATA GENERATION CIRCUIT AND DATA INPUT SELECTION CIRCUIT

TECHNICAL FIELD

An embodiment of the present invention relates to a photodetector.

BACKGROUND ART

In recent years, technological development of a photodetector which inputs data with the use of a photodetector circuit (also referred to as an optical sensor) capable of generating data having a value corresponding to the illuminance of incident light, a photodetector which inputs data with the use of the photodetector circuit and outputs data in accordance with the input data, and the like has been advanced.

As an example of the photodetector, an image sensor can be given. As examples of the image sensor, a charge coupled device (CCD) image sensor, a complementary metal oxide semiconductor (CMOS) image sensor, and the like can be given (e.g., Patent Document 1).

As a driving system of CMOS image sensors, there are a rolling shutter system and a global shutter system. In a rolling shutter system, a plurality of photodetector circuits arranged in row and column directions are exposed to light row by row. In a global shutter system, photodetector circuits in all the rows are exposed to light at once.

REFERENCE

[Patent Document 1] Japanese Published Patent Application No. 2007-104186

DISCLOSURE OF INVENTION

However, conventional photodetectors have a problem of large variations of generated data due to noise, or the like. Examples of the noise are random noise and fixed pattern noise. As random noise, reset noise can be given, for example. Reset noise is included in an optical data signal generated by a photodetector circuit. The random noise is generated because of connection resistance between elements in a photodetector circuit, for example. Fixed pattern noise is generated because of variations in electrical characteristics of elements in a photodetector, for example.

For example, when the light-receiving area of a photodetector circuit in a photodetector is small, the amount of photocurrent generated in accordance with the amount of received light becomes smaller. Accordingly, the adverse effects of leakage current and noise become considerable, which makes it difficult to obtain correct data. To obtain data is also referred to as "capture data". For example, photodetectors mounted on small devices such as mobile phones become smaller and therefore the adverse effects of leakage current and noise, which affect the amount of received light, become a more serious problem.

It is an object of one embodiment of the present invention to reduce adverse effects of noise.

In one embodiment of the present invention, difference data of data of two periods that are different from each other and generated by a photodetector circuit. By generation of difference data, the amount of change due to noise is removed from the data.

One embodiment of the present invention is a photodetector including a photodetector circuit, a difference data generation circuit, and a data input selection circuit.

The photodetector circuit has a function of generating an optical data signal.

A first data signal and a second data signal are input to the difference data generation circuit. In addition, the difference data generation circuit has a function of generating difference data of data of the first data signal and data of the second data signal.

The data input selection circuit has a function of determining that data of the optical data signal is regarded as the data of the first data signal or the data of the second data signal.

According to one embodiment of the present invention, the amount of change due to noise can be removed from generated data; therefore, the adverse effects of noise can be reduced.

BEST MODE FOR CARRYING OUT THE INVENTION

Examples of embodiments for describing the present invention will be explained below with reference to the drawings. Note that it will be readily appreciated by those skilled in the art that details of the embodiments can be modified in various ways without departing from the spirit and scope of the present invention. The present invention is therefore not limited to the following description of the embodiments.

Note that the contents in different embodiments can be combined with one another as appropriate. In addition, the contents of the embodiments can be replaced with each other as appropriate.

Further, the ordinal numbers such as "first" and "second" are used to avoid confusion between components and do not limit the number of each component.

Embodiment 1

In this embodiment, an example of a photodetector capable of generating difference data will be described with reference to FIGS. 1A, 1B-1, and 1B-2.

Figure 1A:
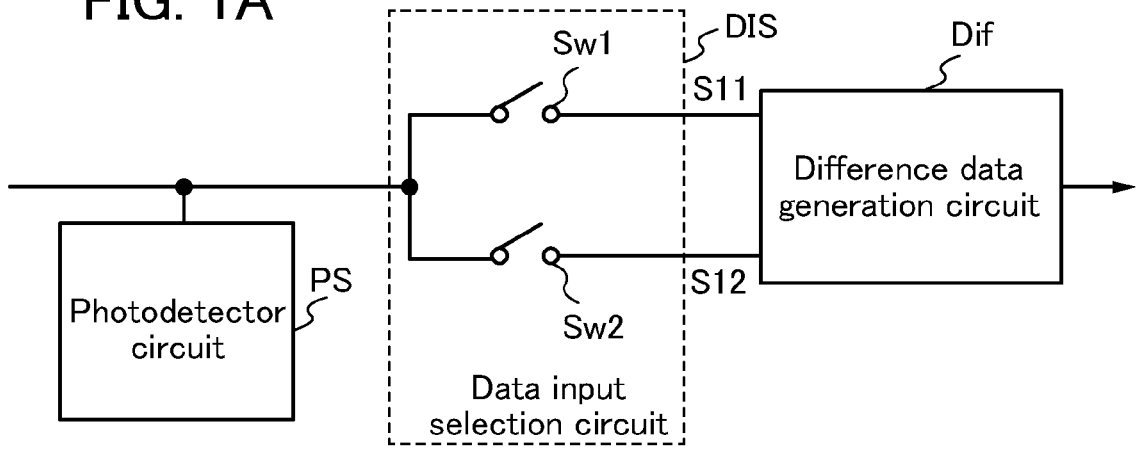
FIGS. 1A, 1B-1, and 1B-2 illustrate an example of a photodetector.

A photodetector illustrated in FIG. 1A includes a photodetector circuit PS, a difference data generation circuit Dif, and a data input selection circuit DIS.

The photodetector circuit PS has a function of generating an optical data signal. For example, data of an optical data signal obtained in a capture period corresponds to the illuminance of light entering the photodetector circuit (the amount of received light). A plurality of photodetector circuits may be provided in the photodetector.

The photodetector circuit PS includes a photoelectric conversion element and a field-effect transistor.

A data signal S11 and a data signal S12 are input to a first input terminal and a second input terminal of the difference data generation circuit Dif, respectively. The difference data generation circuit Dif has a function of generating difference data of data of the data signal S11 and data of the data signal S12.

The difference data generation circuit Dif includes a circuit with a function of performing a subtraction operation of the data of the data signal S11 and the data of the data signal S12. As the difference data generation circuit Dif, for example, a differential amplifier, a subtractor, or the like can be used.

The data input selection circuit DIS has a function of determining that data of the optical data signal generated by the photodetector circuit PS to be input to the difference data generation circuit Dif is regarded as the data of the data signal S11 or the data of the data signal S12.

The data input selection circuit DIS includes, for example, a switch Sw1 and the switch Sw2. The switch Sw1 has a function of determining whether or not the data of the optical data signal is input as the data of the data signal S11 to the difference data generation circuit Dif. The switch Sw2 has a function of determining whether or not the data of the optical data signal is input as the data of the data signal S12 to the difference data generation circuit Dif. Note that the switch Sw1 and the switch Sw2 each may be formed using a plurality of elements.

Next, as an example of a method for driving the photodetector of this embodiment, an example of a method for driving the photodetector illustrated in FIG. 1A will be described with reference to FIGS. 1B-1 and 1B-2.

In an example of a method for driving the photodetector illustrated in FIG. 1A, an optical data signal is generated by the photodetector circuit PS. At this time, when data of the optical data signal is data in a period TA, the data of the optical data signal (also referred to as D_PD) is DA (D_PD=DA). When the data of the optical data signal is data in a period TB, the data of the optical data signal (also referred to as D_PD) is DB (D_PD=DB). The period TA is, for example, a period in which the photodetector circuit PS is in a reset mode (also referred to as reset period). The period TB is a period in which the photodetector circuit PS is in a capture mode (also referred to as capture period).

In addition, common noise components are included in the data of the optical data signal that is DA and the data of the optical data signal that is DB.

Figures 1, 1B:
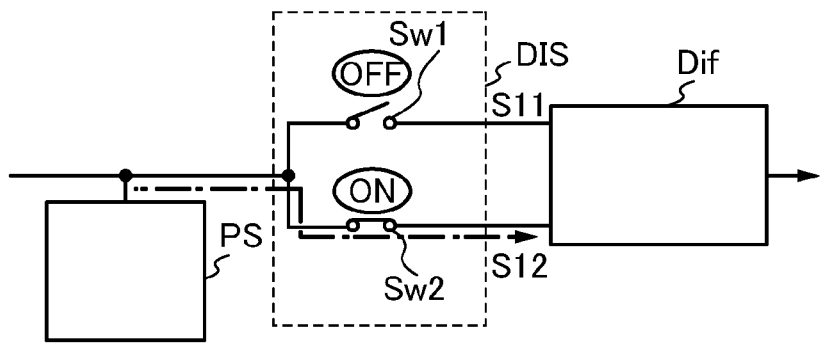

When the data of the optical data signal is DA (D_PD=DA), as illustrated in FIG. 1B-1, the data input selection circuit DIS inputs the data of the optical data signal as data of the data signal S12 to the difference data generation circuit Dif. For example, the switch Sw2 is turned on and the switch Sw1 is turned off, whereby the data of the optical data signal can be input as the data of the data signal S12 to the difference data generation circuit Dif.

Figures 1, 1B, 2:
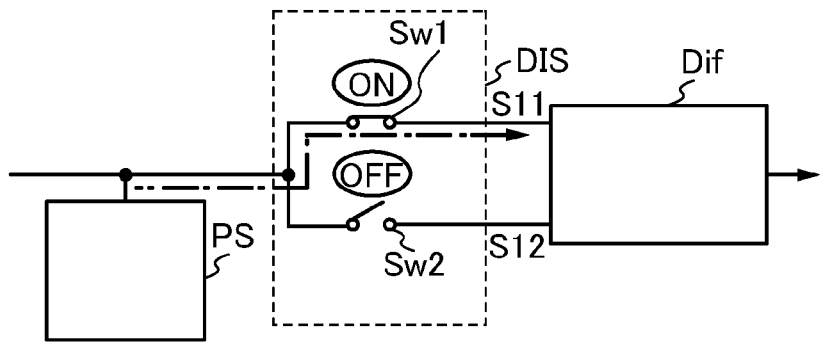

When the data of the optical data signal is DB (D_PD=DB), as illustrated in FIG. 1B-2, the data input selection circuit DIS inputs the data of the optical data signal as data of the data signal S11 to the difference data generation circuit Dif. For example, the switch Sw1 is turned on and the switch Sw2 is turned off, whereby the data of the optical data signal can be input as the data of the data signal S11 to the difference data generation circuit Dif.

The difference data generation circuit Dif generates difference data of the data of the data signal S11 and the data of the data signal S12. The amount of change corresponding to a common noise, which is included in the data of the data signal S11 (DB) and the data of the data signal S12 (DA), is removed from the generated difference data.

Further, the difference data generation circuit Dif outputs the generated difference data as a signal.

The above is the example of the method for driving the photodetector illustrated in FIG. 1A.

As described with reference to FIGS. 1A, 1B-1, and 1B-2, in an example of the photodetector in this embodiment, difference data of optical data signals are generated in a photodetector circuit in different two periods. Data of the optical data signals in two periods includes common noise components; therefore, the amount of change due to noise can be removed by generation of the difference data. Thus, adverse effects of noise can be reduced. In addition, the quality of a captured image can be improved. Note that the above method for removing the amount of change due to noise is also referred to as correlated double sampling (also referred to as CDS).

In an example of the photodetector of this embodiment, in accordance with the data of the optical data signal in the photodetector circuit, a data input selection circuit determines that the above data is regarded as data of a first data signal or as data of a second data signal. Since difference data can be generated by one kind of optical data signal with this structure, the number of elements in the photodetector circuit can be small. Accordingly, the aperture ratio of the photodetector can be improved.

Embodiment 2

In this embodiment, a configuration example of the photodetector described in Embodiment 1 will be explained with reference to FIGS. 2A and 2B, FIGS. 3A and 3B, and FIGS. 4A and 4B. Note that description of the part which is the same as the photodetector described in Embodiment 1 is skipped because the description of the photodetector described in Embodiment 1 can be referred to as appropriate.

Figure 2A:
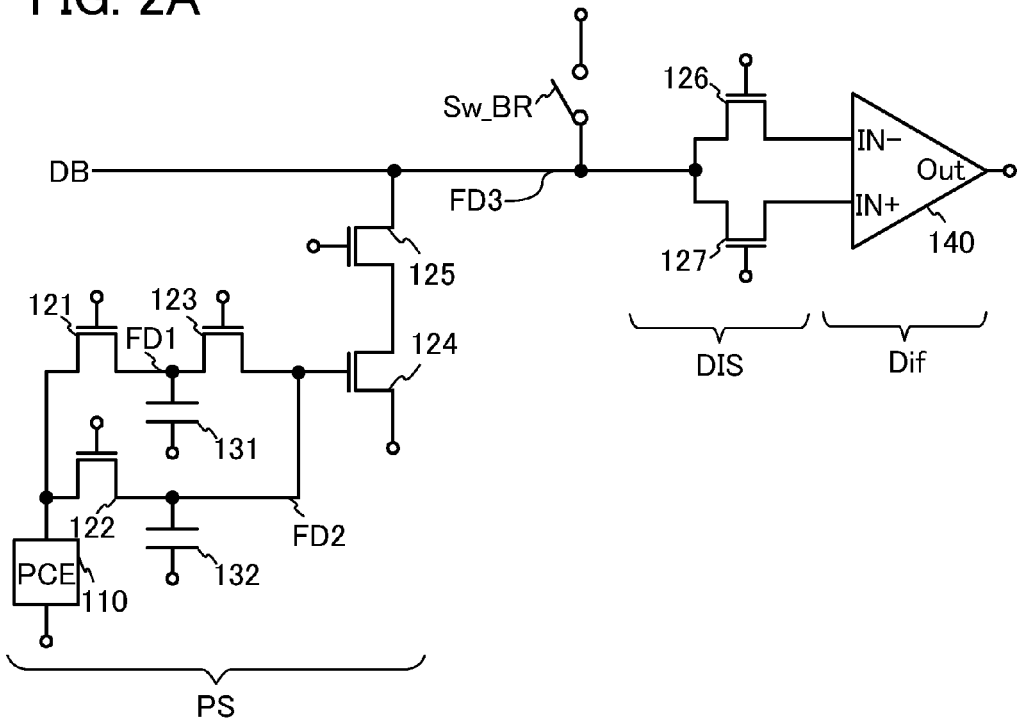
FIGS. 2A and 2B illustrate an example of a photodetector.

A photodetector illustrated in FIG. 2A includes the photodetector circuit PS, the difference data generation circuit Dif, and the data input selection circuit DIS, like the photodetector illustrated in FIG. 1A. Further, the photodetector illustrated in FIG. 2A includes a data bus DB and a switch Sw_BR.

The photodetector circuit PS includes a photoelectric conversion element 110, field-effect transistors 121 to 125, and capacitors 131 and 132.

The photoelectric conversion element 110 includes a first current terminal and a second current terminal, and current (also referred to as photocurrent) flows between the first current terminal and the second current terminal in accordance with the illuminance of incident light.

A photodetection reset signal that is a pulse signal is input to the first current terminal of the photoelectric conversion element 110. A potential Vx that is a unit potential may be supplied to the first current terminal of the photoelectric conversion element 110.

The photoelectric conversion element 110 can be a photodiode, a phototransistor, or the like, for example. In the case of a photodiode, one of an anode and a cathode of the photodiode corresponds to the first current terminal of the photoelectric conversion element. In addition, the other of the anode and the cathode corresponds to the second current terminal of the photoelectric conversion element. In the case of a field-effect phototransistor, one of a source and a drain of the field-effect phototransistor corresponds to the first current terminal of the photoelectric conversion element. In addition, the other of the source and the drain of the field-effect phototransistor corresponds to the second current terminal of the photoelectric conversion element. Note that the photoelectric conversion element 110 is not limited thereto and may be a bipolar phototransistor.

One of a source and a drain of the field-effect transistor 121 is connected to the second current terminal of the photoelectric conversion element 110. A first charge transmission control signal that is a pulse signal is input to a gate of the field-effect transistor 121. The field-effect transistor 121 has a function of controlling transmission of charge corresponding to the illuminance of light entering the photoelectric conversion element 110. In this case, the transistor with such a function is also referred to as a charge transmission control transistor.

One of a source and a drain of the field-effect transistor 122 is connected to the second current terminal of the photoelectric conversion element 110. A second charge transmission control signal that is a pulse signal is input to a gate of the field-effect transistor 122. The field-effect transistor 122 has a function of controlling transmission of charge corresponding to the illuminance of light entering the photoelectric conversion element 110.

One of a pair of electrodes of the capacitor 131 is electrically connected to the other of the source and the drain of the field-effect transistor 121. A potential Vc is supplied to the other of the pair of electrodes of the capacitor 131. The potential Vc is an arbitrary value. The capacitor 131 has a function as a first charge holding capacitor.

One of a pair of electrodes of the capacitor 132 is electrically connected to the other of the source and the drain of the field-effect transistor 122. The potential Vc that is a unit potential is supplied to the other of the pair of electrodes of the capacitor 132. The capacitor 132 has a function as a second charge holding capacitor.

One of a source and a drain of the field-effect transistor 123 is electrically connected to the other of the source and the drain of the field-effect transistor 121. A third charge transmission control signal that is a pulse signal is input to a gate of the field-effect transistor 123. Note that a connection portion of the one of the source and the drain of the field-effect transistor 123 and the other of the source and the drain of the field-effect transistor 121 is also referred to as the node FD1. The field-effect transistor 123 has a function of controlling transmission of charge corresponding to the illuminance of light entering the photoelectric conversion element 110.

A potential Vb that is a unit potential is supplied to one of a source and a drain of the field-effect transistor 124. A gate of the field-effect transistor 124 is electrically connected to the other of the source and the drain of the field-effect transistor 122 and the other of the source and the drain of the field-effect transistor 123. Note that a connection portion of the gate of the field-effect transistor 124, the other of the source and the drain of the field-effect transistor 122, and the other of the source and the drain of the field-effect transistor 123 is also referred to as the node FD2. The potential of an optical data signal is set in accordance with current flowing between the source and the drain of the field-effect transistor 124. The field-effect transistor 124 has a function of amplifying data corresponding to the photocurrent of the photoelectric conversion element 110. A transistor with such a function is also referred to as an amplifying transistor.

One of a source and a drain of the field-effect transistor 125 is electrically connected to the other of the source and the drain of the field-effect transistor 124. In addition, the other of the source and the drain of the field-effect transistor 125 is electrically connected to the data bus DB. Further, an output selection signal that is a pulse signal is input to a gate of the field-effect transistor 125. The field-effect transistor 125 has a function of determining whether or not an optical data signal generated by the photodetector circuit PS is output. A transistor with such a function is also referred to as an output selection transistor. Note that a connection portion of the other of the source and the drain of the field-effect transistor 125 and the data bus DB is also referred to as the node FD3.

The difference data generation circuit Dif includes a differential amplifier 140.

The differential amplifier 140 includes a negative input terminal (also referred to as a terminal IN−), a positive input terminal (also referred to as a terminal IN+), and an output terminal (also referred to as the terminal Out). The differential amplifier 140 has a function of generating difference data of data of a signal input through the negative input terminal (the terminal IN−) and data of a signal input through the positive input terminal (the terminal IN+) and outputting a signal of a potential corresponding to the difference data through the output terminal (the terminal Out).

The data input selection circuit DIS includes a field-effect transistor 126 and a field-effect transistor 127.

One of a source and a drain of the field-effect transistor 126 is electrically connected to the data bus DB. Accordingly, the one of the source and the drain of the field-effect transistor 126 is electrically connected to the other of the source and the drain of the field-effect transistor 125. In addition, the other of the source and the drain of the field-effect transistor 126 is electrically connected to the negative input terminal of the differential amplifier 140. Further, a first data input selection signal that is a pulse signal is input to a gate of the field-effect transistor 126. The field-effect transistor 126 has a function of determining whether or not data is input to the difference data generation circuit Dif. A transistor with such a function is also referred to as a data input selection transistor.

One of a source and a drain of the field-effect transistor 127 is electrically connected to the data bus DB. Accordingly, the one of the source and the drain of the field-effect transistor 127 is electrically connected to the other of the source and the drain of the field-effect transistor 125. In addition, the other of the source and the drain of the field-effect transistor 127 is electrically connected to the positive input terminal of the differential amplifier 140. Further, a second data input selection signal that is a pulse signal is input to a gate of the field-effect transistor 127. The field-effect transistor 127 has a function of selecting input of data to the difference data generation circuit Dif.

One or more of the field-effect transistors 121 to 127 can be field-effect transistors with low off-state current, for example. In this case, the off-state current per micrometer of channel width of the field-effect transistors 121 to 127 is 10 aA ($1\times10^{-17}$ A) or lower, preferably 1 aA ($1\times10^{-18}$ A) or lower, more preferably 10 zA ($1\times10^{-20}$ A) or lower, further preferably 1 zA ($1\times10^{-21}$ A) or lower, still further preferably 100 yA ($1\times10^{-22}$ A) or lower.

As the above field-effect transistor with low off-state current, it is possible to use a field-effect transistor including a semiconductor layer in which a channel is formed and which has a wider band gap than silicon, for example, 2 eV or more, preferably 2.5 eV or more, more preferably 3 eV or more. As the field-effect transistor having such a wide bandgap, a field-effect transistor including an oxide semiconductor layer in which a channel is formed can be used, for example.

As the oxide semiconductors layer, for example, an In-based oxide (e.g., indium oxide), a Sn-based oxide (e.g., tin oxide), and a Zn-based oxide (e.g., zinc oxide) can be given.

Alternatively, as the oxide semiconductor layer, a four-component metal oxide, a three-component metal oxide, or a two-component metal oxide may be used, for example. Note that the oxide semiconductor layer may include gallium as a stabilizer for reducing variation in characteristics. A metal oxide which can be used as the above oxide semiconductor layer may include tin as a stabilizer. A metal oxide which can be used as the above oxide semiconductor layer may include hafnium as a stabilizer. A metal oxide which can be used as the above oxide semiconductor layer may include aluminum as a stabilizer. A metal oxide which can be used as the above oxide semiconductor layer may include one or more of following material as a stabilizer: lanthanum, cerium, praseodymium, neodymium, samarium, europium, gadolinium, terbium, dysprosium, holmium, erbium, thulium, ytterbium, and lutetium, which are lanthanoid. Further, the metal oxide that can be used as the oxide semiconductor layer may contain silicon oxide.

Examples of a four-component metal oxide are an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

Examples of the three-component metal oxide are an In—Ga—Zn-based oxide, an In—Sn—Zn-based oxide, an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, and an In—Lu—Zn-based oxide.

Examples of a two-component metal oxide are an In—Zn-based oxide, a Sn—Zn-based oxide, an Al—Zn-based oxide, a Zn—Mg-based oxide, a Sn—Mg-based oxide, an In—Mg-based oxide, an In—Sn-based oxide, and an In—Ga-based oxide.

The oxide semiconductor layer may be an oxide semiconductor layer including CAAC-OS (c-axis aligned crystalline oxide semiconductor).

CAAC-OS is a mixed phase structure of a crystal region and an amorphous region. Further, in the crystal included in the crystal region, a c-axis is aligned in a direction perpendicular to a surface where the semiconductor layer is formed or a surface of the semiconductor layer, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Therefore, the CAAC-OS is not completely single crystal nor completely amorphous. Note that when the CAAC-OS includes a plurality of crystal regions, the directions of the a-axes and the b-axes of crystals of the plurality of crystal regions may be different from each other.

Note that in most cases, the crystal region of CAAC-OS fits inside a cube whose one side is less than 100 nm. From an observation image obtained with a transmission electron microscope (TEM), a boundary between a crystal region and an amorphous region in the CAAC-OS is not always clear. Further, a grain boundary in the CAAC-OS is not found. Thus, in the CAAC-OS, a reduction in electron mobility, due to the grain boundary, is prevented.

In the CAAC-OS, distribution of crystal regions is not necessarily uniform in the depth direction of the layer. For example, when a crystal growth occurs from a surface side of the semiconductor layer to form an oxide semiconductor layer of CAAC-OS, in some cases, the proportion of the crystal portions in the vicinity of the surface of the oxide semiconductor layer in the CAAC-OS portion is high and the proportion of the amorphous portions in the vicinity of the surface where the oxide semiconductor layer in the CAAC-OS portion is formed is high.

Since the c-axes of the crystal included in the crystal region of the CAAC-OS are perpendicular to the surface where the oxide semiconductor layer in the CAAC-OS portion is formed or the surface of the oxide semiconductor layer in the CAAC-OS portion, the directions of the c-axes of the crystal portions may be different from each other depending on the shape of the oxide semiconductor layer in the CAAC-OS portion (the cross-sectional shape of the surface where the oxide semiconductor layer in the CAAC-OS portion is formed or the cross-sectional shape of the surface of the oxide semiconductor layer in the CAAC-OS portion). Note that the c-axes in the crystal regions of the CAAC-OS are substantially perpendicular to the surface where the oxide semiconductor layer in the CAAC-OS portion is formed or the surface of the oxide semiconductor layer in the CAAC-OS portion.

For example, the CAAC-OS can be formed by a sputtering method with a polycrystalline oxide semiconductor sputtering target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the flat-plate-like sputtered particle reaches a substrate while maintaining their crystal state, whereby a crystal state of the sputtering target is transferred to a substrate. In this manner, the CAAC-OS is formed.

For the deposition of the CAAC-OS, the following conditions are preferably used.

For example, the CAAC-OS is formed while the impurity concentration is reduced, whereby the crystal state of the oxide semiconductor can be prevented from being broken by the impurities. For example, impurities (e.g., hydrogen, water, carbon dioxide, or nitrogen) which exist in the deposition chamber are preferably reduced. For example, a deposition gas whose dew point is −80° C. or lower, preferably −100° C. or lower is preferably used as a deposition gas.

By increasing the substrate heating temperature during the deposition, migration of a sputtered particle is likely to occur after the sputtered particle is attached to a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particle reaches the substrate, migration occurs on the substrate surface, so that a flat plane of the flat-plate-like sputtered particle is attached to the substrate.

Furthermore, it is preferable that the proportion of oxygen in the deposition gas be increased and the power be optimized in order to reduce plasma damage at the deposition. The proportion of oxygen in the deposition gas is 30 vol % or higher, preferably 100 vol %.

As an example of the sputtering target, an In—Ga—Zn—O compound target is described below.

The In—Ga—Zn—O compound target, which is polycrystalline, is made by mixing $InO_X$ powder, $GaO_Y$ powder, and $ZnO_Z$ powder in a predetermined ratio, applying pressure, and performing heat treatment at a temperature higher than or equal to 1000° C. and lower than or equal to 1500° C. Note that X, Y, and Z are each a given positive number. Here, the predetermined ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired sputtering target.

With an oxide semiconductor layer including CAAC-OS in the semiconductor layer of the field-effect transistor in which a channel is formed, fluctuation in electric characteristics of the field-effect transistor due to irradiation with visible light or ultraviolet light can be suppressed and the reliability of the field-effect transistor can be improved.

Further, the field-effect transistors 121 to 127 may be field-effect transistors with different characteristics from each other.

The photodetector may be provided with a light blocking layer that blocks light entering the field-effect transistors 121 to 127. With the light blocking layer, variations in electrical characteristics of the field-effect transistors can be suppressed.

The data bus DB has a function of transmitting data of an optical data signal, which is generated by the photodetector circuit PS.

A switch Sw_BR has a function of determining whether or not the data bus DB is reset. Note that the switch Sw_BR is formed by using a plurality of elements.

Figure 2B:
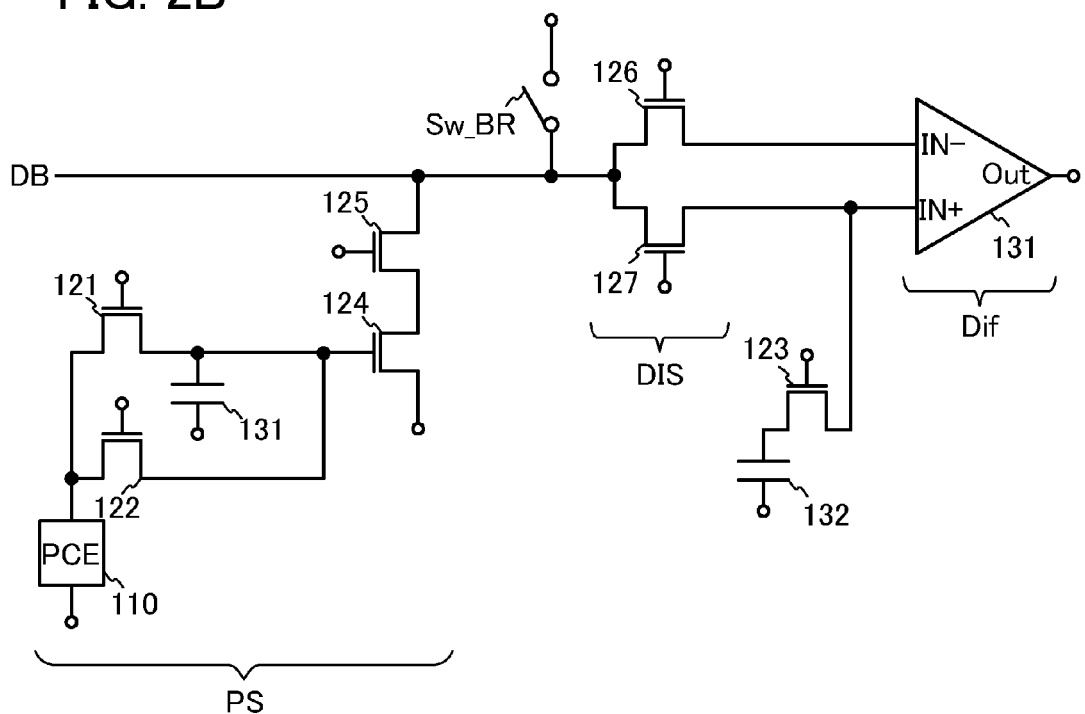

The photodetector illustrated in FIG. 2B is different from the photodetector illustrated in FIG. 2A in a connection relation of the field-effect transistor 123 and a connection relation of the capacitor 131.

In the photodetector illustrated in FIG. 2B, the field-effect transistor 123 and the capacitor 132 are provided in a part which is not the photodetector circuit PS. The one of the source and the drain of the field-effect transistor 123 is electrically connected to the other of the source and the drain of the field-effect transistor 127. The one of the pair of electrodes of the capacitor 132 is electrically connected to the other of the source and the drain of the field-effect transistor 123. The potential Vc is supplied to the other of the pair of electrodes of the capacitor 132. The gate of the field-effect transistor 124 is electrically connected to the other of the source and the drain of the field-effect transistor 121 and the other of the source and the drain of the field-effect transistor 122.

Figure 3A:
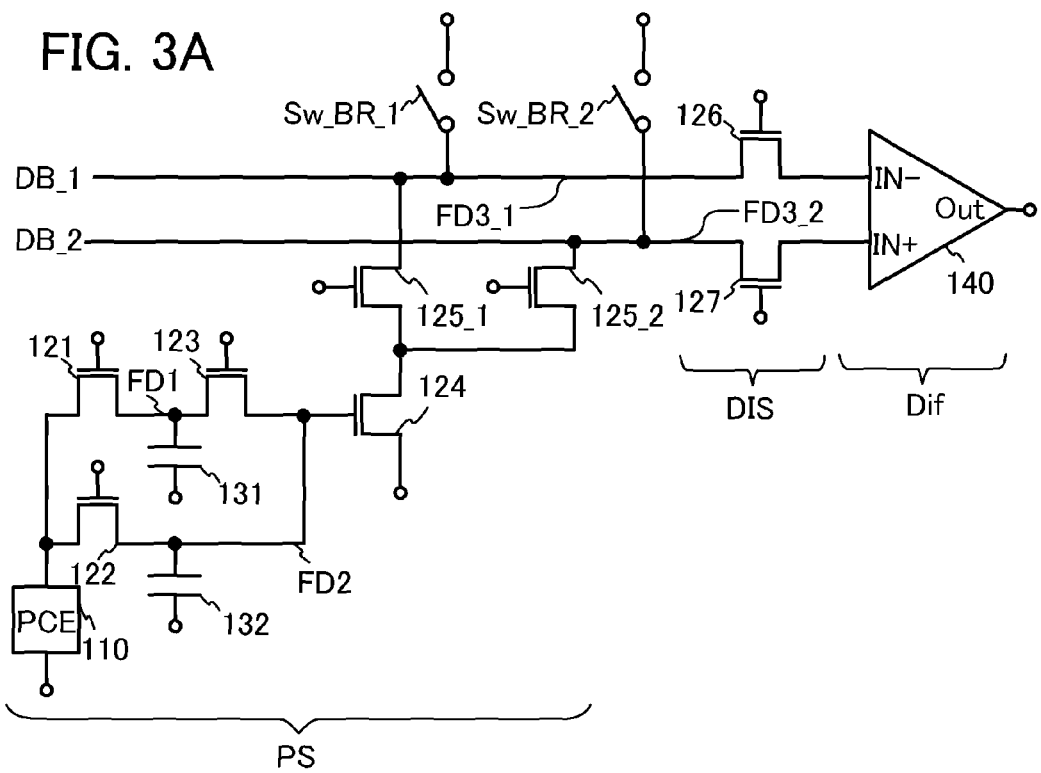
FIGS. 3A and 3B illustrate an example of a photodetector.
Figure 3B:
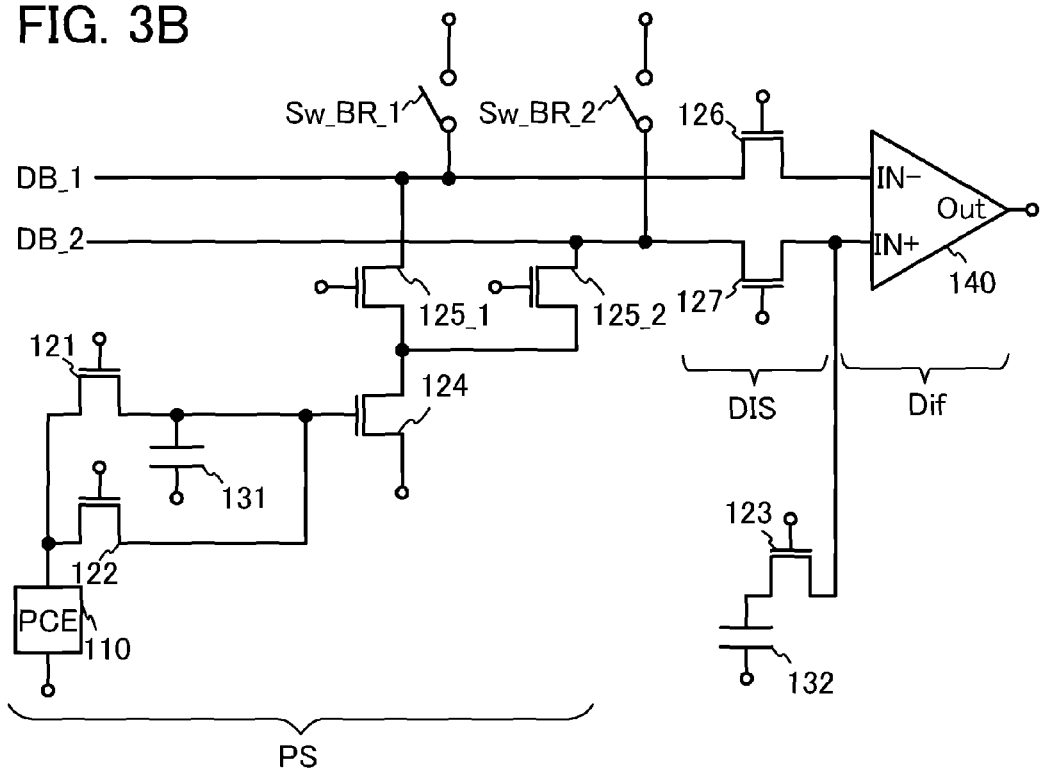

A photodetector illustrated in FIG. 3A includes a field-effect transistor 125_1 and a field-effect transistor 125_2 instead of the field-effect transistor 125 of the photodetector illustrated in FIG. 2A. A photodetector illustrated in FIG. 3B includes the field-effect transistor 125_1 and the field-effect transistor 125_2 instead of the field-effect transistor 125 of the photodetector illustrated in FIG. 2B.

At this time, the photodetector further includes a data bus DB_1 and a data bus DB_2 instead of the data bus DB. Furthermore, instead of the switch Sw_BR, the photodetector includes a switch Sw_BR1 for determining whether or not the data bus DB_1 is reset and a switch Sw_BR2 for determining whether or not the data bus DB_2 is reset.

One of a source and a drain of the field-effect transistor 125_1 and one of a source and a drain of the field-effect transistor 125_2 are electrically connected to the one of the source and the drain of the field-effect transistor 124. Further, the other of the source and the drain of the field-effect transistor 125_1 is electrically connected to the data bus DB_1. The other of the source and the drain of the field-effect transistor 125_2 is electrically connected to the data bus DB_2. The one of the source and the drain of the field-effect transistor 126 is electrically connected to the data bus DB_1. The one of the source and the drain of the field-effect transistor 127 is electrically connected to the data bus DB_2. A connection portion of the other of the source and the drain of the field-effect transistor 125_1 and the data bus DB_1 is also referred to as the node FD3_1. A connection portion of the other of the source and the drain of the field-effect transistor 125_2 and the data bus DB_2 is also referred to as the node FD3_2.

Next, as an example of a method of driving photodetector of this embodiment, an example of a method of driving a photodetector in FIG. 4A will be described with reference to a timing chart shown in FIG. 4B. In the case of the photodetector illustrated in FIG. 4A, the photoelectric conversion element 110 in the photodetector illustrated in FIG. 2A is a photodiode, the switch Sw_BR is a field-effect transistor 128, and the field-effect transistors 121 to 128 are n-channel transistors.

At this time, the anode of the photodiode, which is the photoelectric conversion element 110, is electrically connected to a photodetection reset signal line PR for inputting a photodetection reset signal.

The one of the source and the drain of the field-effect transistor 121 is electrically connected to the cathode of the photoelectric conversion element 110. The gate of the field-effect transistor 121 is electrically connected to a first charge transmission control signal line TX1 for inputting a first charge transmission control signal.

The one of the source and the drain of the field-effect transistor 122 is electrically connected to the cathode of the photoelectric conversion element 110. The gate of the field-effect transistor 122 is electrically connected to a second charge transmission control signal line TX2 for inputting a second charge transmission control signal.

The gate of the field-effect transistor 123 is electrically connected to a third charge transmission control signal line TX3 for inputting the third charge transmission control signal.

The gate of the field-effect transistor 125 is electrically connected to an output selection signal line Sel for inputting an output selection signal.

The gate of the field-effect transistor 126 is electrically connected to a first data input selection signal line Select1 for inputting a first data input selection signal.

The gate of the field-effect transistor 127 is electrically connected to a second data input selection signal line Select2 for inputting a second data input selection signal.

A potential Va that is a unit potential is supplied to one of a source and a drain of the field-effect transistor 128. The other of the source and the drain of the field-effect transistor 128 is electrically connected to the data bus DB. A gate of the field-effect transistor 128 is electrically connected to a bus reset signal line BR for inputting a bus reset signal.

The potential Va, the potential Vb, and the potential Vc are a low-level potential, a high-level potential, and a ground potential, respectively. The high-level potential is equal or substantially equal to a high-level potential of a binary digital signal. The low-level potential is equal or substantially equal to a low-level potential of a binary digital signal. The low-level potential is equal or substantially equal to a ground potential.

Whenever the potential of the bus reset signal line BR becomes high, the data bus DB is reset.

Figure 4A:
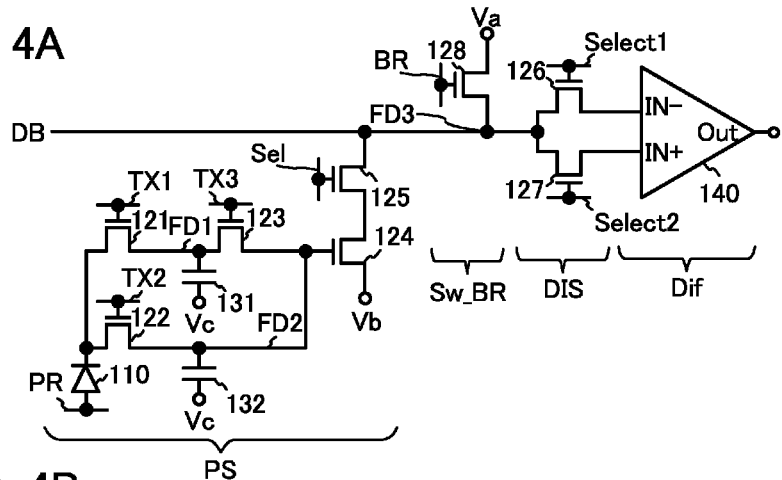
FIGS. 4A and 4B illustrate an example of a photodetector.
Figure 4B:
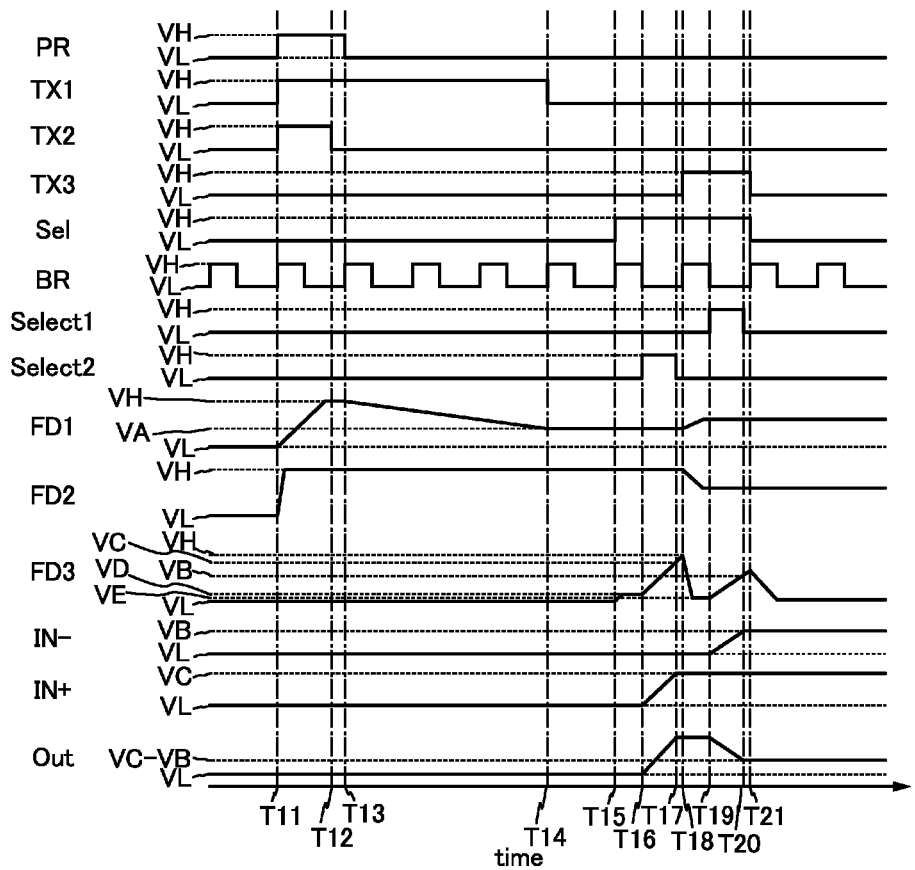

In an example of a method for driving the photodetector illustrated in FIG. 4A, as illustrated in FIG. 4B, in a time T11 (also referred to as a reset operation start time), the photodetection reset signal line PR, the first charge transmission control signal line TX1, and the second charge transmission control signal line TX2 are made to have a high-level potential (also referred to as VH); and the third charge transmission control signal line TX3, the output selection signal line Sel, the first data input selection signal line Select1, and the second data input selection signal line Select2 are made to have a low-level potential (also referred to as VL).

In this case, when the photoelectric conversion element 110 is forward-biased, charge is accumulated in the capacitor 131 and the capacitor 132; therefore, the potentials of the node FD1 and the node FD2 are equal or substantially equal to a high-level potential. As a result, the photodetector circuit PS is in a reset mode.

Next, in a time T12 (also referred to as a reset operation completion time), the second charge transmission control signal line TX2 is made to have a low-level potential. The photodetection reset signal line PR and the first charge transmission control signal line TX1 hold the high-level potential. The third charge transmission control signal line TX3, the output selection signal line Sel, the first data input selection signal line Select1, and the second data input selection signal line Select2 hold a low-level potential.

In this case, the node FD2 becomes a floating state, and the potential of the node FD2 is held at a level equal or substantially equal to that of a high-level potential.

Next, in a time T13 (also referred to as a capture operation start time), the photodetection reset signal line PR is made to have a low-level potential. The first charge transmission control signal line TX1 holds the high-level potential. The second charge transmission control signal line TX2, the third charge transmission control signal line TX3, the output selection signal line Sel, the first data input selection signal line Select1, and the second data input selection signal line Select2 hold the low-level potential.

In that case, the photoelectric conversion element 110 is reverse-biased. Accordingly, photocurrent is generated in the photoelectric conversion element 110 on the basis of the illuminance of incident light. In addition, the charge accumulated in the capacitor 131 is lost in accordance with the photocurrent. On the other hand, since the second charge transmission control signal line TX2 holds the low-level potential, charge in the capacitor 132 is held. As a result, the photodetector circuit PS is in a capture mode.

Next, in a time T14 (also referred to as a capture operation completion time), the first charge transmission control signal line TX1 is made to have a low-level potential. Note that the photodetection reset signal line PR, the second charge transmission control signal line TX2, the third charge transmission control signal line TX3, the output selection signal line Sel, the first data input selection signal line Select1, and the second data input selection signal line Select2 hold the low-level potential.

In this case, capture operation is completed. In addition, the photocurrent allows the potential of the node FD1 to be VA. The value of VA depends on the photocurrent of the photoelectric conversion element 110. Note that the potential of the node FD2 is kept to be equal or substantially equal to a high-level potential.

Note that when the photodetector circuit in this embodiment is driven in a plurality of frame periods, data of an optical data signal of the photodetector circuit in a reset mode and data of an optical data signal of the photodetector circuit in a capture mode include common noise components during a time from a reset start time of a frame period to a reset start time of the next frame period.

Next, in a time T15 (also referred to as a photodetector circuit selection operation start time), the output selection signal line Sel and the bus reset signal line BR are made to have a high-level potential. Note that the photodetection reset signal line PR, the first charge transmission control signal line TX1, the second charge transmission control signal line TX2, the third charge transmission control signal line TX3, the first data input selection signal line Select1, and the second data input selection signal line Select2 hold the low-level potential.

At this time, the potential of the node FD3 becomes VD. VD depends on each channel resistance of the field-effect transistor 124, the field-effect transistor 125, and the field-effect transistor 128, and wiring resistance. VD is higher than Va and lower than Vb.

Next, in a time T16 (also referred to as a first selection operation start time), the bus reset signal line BR is made to have a low-level potential and the second data input selection signal line Select2 is made to have a high-level potential. Note that the output selection signal line Sel holds the high-level potential. The photodetection reset signal line PR, the first charge transmission control signal line TX1, the second charge transmission control signal line TX2, the third charge transmission control signal line TX3, and the first data input selection signal line Select1 hold the low-level potential.

In this case, the potential of the node FD3 and the potential of the positive input terminal (the terminal IN+) of the differential amplifier 140 are changed. After that, the potential of the node FD3 and the potential of the positive input terminal (the terminal IN+) of the differential amplifier 140 become VC. VC corresponds to the value of current flowing between the source and the drain of the field-effect transistor 124. That is, the potential of the positive input terminal (the terminal IN+) of the differential amplifier 140 corresponds to the potential of the gate of the field-effect transistor 124; therefore, the potential of the positive input terminal (the terminal IN+) corresponds to the potential of the gate of the field-effect transistor 124 in a reset mode.

Next, in a time T17 (a first selection operation completion time), the second data input selection signal line Select2 is made to have a low-level potential. Note that the output selection signal line Sel holds the high-level potential. The photodetection reset signal line PR, the first charge transmission control signal line TX1, the second charge transmission control signal line TX2, the third charge transmission control signal line TX3, and the first data input selection signal line Select1 hold the low-level potential.

In this case, the potential of the positive input terminal (the terminal IN+) of the differential amplifier 140 is kept at VC. On the other hand, the potential of the node FD3 keeps increasing until the next reset operation of the data bus DB is performed. The maximum potential of the node FD3 at this time is VH.

Next, in a time T18 (also referred to as a capture data read operation start time), the third charge transmission control signal line TX3 and the bus reset signal line BR are made to have a high-level potential. Note that the output selection signal line Sel holds the high-level potential. The photodetection reset signal line PR, the first charge transmission control signal line TX1, the second charge transmission control signal line TX2, the first data input selection signal line Select1, and the second data input selection signal line Select2 hold the low-level potential.

At this time, the node FD1 and the node FD2 become a conduction state. The potential of the node FD1 (FD2) is (C131/C131+C132)×VFD1+(C132/C131+C132)×VFD2.

Note that VFD1 is the potential of the node FD1 after the first charge transmission control signal line TX1 is made to have a low-level potential and before the node FD1 is in conduction with the node FD2 (the potential of the node FD1 from the time T14 to the time T18), and VFD2 is the potential of the node FD2 after the first charge transmission control signal line TX1 is made to have a low-level potential and before the node FD2 is in conduction with the node FD1 (the potential of the node FD2 from the time T14 to the time T18). In this manner, the potential of the node depends on a ratio of the capacitance of the capacitor 131 to the capacitance of the capacitor 132. For example, in order that at this time the potential of the node FD1 (FD2) be closer to the potential of the node FD1 after the first charge transmission control signal line TX1 is made to have a low-level potential and before the node FD1 is in conduction with the node FD2 (the potential of the node FD1 from the time T14 to the time T18), the capacitance of the capacitor 131 is made to be larger than the capacitance of the capacitor 132.

In a time T18, the potential of the node FD3 becomes VE. In this case, VE is lower than VC.

Next, in a time T19 (also referred to as a second selection operation start time), the bus reset signal line BR is made to have a low-level potential and the first data input selection signal line Select1 is made to have a high-level potential. Note that the third charge transmission control signal line TX3 and the output selection signal line Sel hold the high-level potential. The photodetection reset signal line PR, the first charge transmission control signal line TX1, the second charge transmission control signal line TX2, and the second data input selection signal line Select2 hold the low-level potential.

At this time, the potential of the node FD3 and the potential of the negative input terminal (the terminal IN−) of the differential amplifier 140 are changed. After that, the potential of the node FD3 and the potential of the negative input terminal (the terminal IN−) of the differential amplifier 140 become VB. VB corresponds to the value of current flowing between the source and the drain of the field-effect transistor 124. That is, the potential of the negative input terminal (the terminal IN−) corresponds to the potential of the gate of the field-effect transistor 124; therefore, the potential of the negative input terminal (the terminal IN−) corresponds to the illuminance of light entering the photoelectric conversion element 110.

Next, in a time T20 (also referred to as a second selection operation completion time), the first data input selection signal line Select1 is made to be a low-level potential. Note that the third charge transmission control signal line TX3 and the output selection signal line Sel hold the high-level potential. The bus reset signal line BR, the photodetection reset signal line PR, the first charge transmission control signal line TX1, the second charge transmission control signal line TX2, and the second data input selection signal line Select2 hold the low-level potential.

In this case, the potential of the negative input terminal (the terminal IN−) of the differential amplifier 140 is kept at VB. On the other hand, the potential of the node FD3 keeps increasing until the next reset operation of the data bus DB is performed. The maximum potential of the node FD3 at that time is VH.

Next, in a time T21 (also referred to as a photodetector circuit selection operation completion time), the bus reset signal line BR is made to have a high-level potential, and the third charge transmission control signal line TX3 and the output selection signal line Sel are made to have a low-level potential. Note that the photodetection reset signal line PR, the first charge transmission control signal line TX1, the second charge transmission control signal line TX2, the first data input selection signal line Select1, and the second data input selection signal line Select2 hold the low-level potential.

In this manner, the photodetector circuit selection operation is completed.

Further, from when the negative input terminal (the terminal IN−) of the differential amplifier 140 holds VB (the data of the optical data signal in the capture period) and the positive input terminal (the terminal IN+) of the differential amplifier 140 holds VC (the data of the optical data signal in the reset period), the potential of the output terminal (the terminal Out) of the differential amplifier 140 is VC−VB. For example, in a method for driving the photodetector illustrated in FIG. 4A, the potential of the output terminal (the terminal Out) of the differential amplifier 140 is determined in the time T20 (the second selection operation completion time).

The above is the example of the method for driving the photodetector illustrated in FIG. 4A.

As described with reference to FIGS. 2A and 2B, FIGS. 3A and 3B, and FIGS. 4A and 4B, in an example of the photodetector of this embodiment, difference data of data of the optical data signal in a reset mode and data of the optical data signal in a capture mode is generated. The two data include common noises in the same frame period. For example, in the case where data of the optical data signal in a reset mode is Vr+Vz (Vz is the amount of change due to noise) and data of the optical data signal in a capture mode is Vr+Vz−Vp or Vr+Vz+Vp, the difference data of the two data is generated, and the difference data is Vp or −Vp, which does not depend on Vz. Since noise components can be removed from the data to be generated by generating difference data, adverse effects of noise can be suppressed.

In one example of the photodetector of this embodiment, the plurality of charge transmission control transistors in which different signals are input to gates are used for each photoelectric conversion element, whereby difference data is generated on the basis of one optical data signal; accordingly, the number of elements of the photodetector circuit can be small. Therefore, the aperture ratio of the photodetector can be increased. Since two optical data signals are analog signals, difference data of the data of the two analog signals can be generated. In comparison with the case where difference data of data of digital signals is generated, the accuracy of removing the amount of change due to noise from the generated data can be higher.

In one example of the photodetector of this embodiment, a transistor with low off-state current is used as a charge transmission control transistor, whereby leakage current of the transistor can be low; therefore, a reset potential holding capacitance can be small. Accordingly, the area of the photoelectric conversion element can be larger. As a result, adverse effects of noise can be suppressed.

Embodiment 3

In this embodiment, an example of a photodetector will be described.

Figure 5:
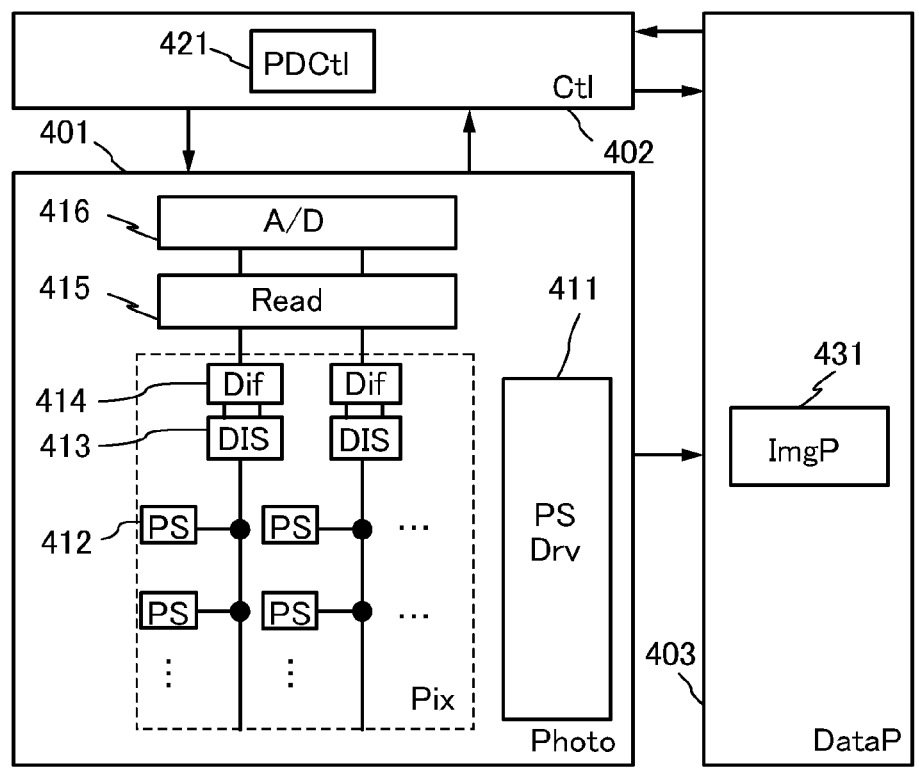
FIG. 5 illustrates an example of a photodetector.

First, a configuration example of the photodetector of this embodiment will be described with reference to FIG. 5. FIG. 5 is a block diagram illustrating a configuration example of photodetector of this embodiment.

A photodetector illustrated in FIG. 5 is an input device which can input data with light.

The photodetector illustrated in FIG. 5 includes a photodetection portion (also referred to as Photo) 401, a control unit (also referred to as Ctl) 402, and a data processing unit (also referred to as DataP) 403.

In addition, the photodetector illustrated in FIG. 5 includes a photodetection driver circuit (also referred to as PSDrv) 411, a plurality of photodetector circuits (also referred to as PS) 412, a data input selection circuit (also referred to as SCtl) 413, a difference data generation circuit (also referred to as Dif) 414, a read circuit (also referred to as Read) 415, an A/D converter circuit (also referred to as A/D) 416, a photodetection control circuit 421, and an image processing circuit (also referred to as ImgP) 431.

The photodetection driver circuit 411 is provided in the photodetection portion 401. The photodetection driver circuit 411 is a circuit for controlling a photodetection operation.

The photodetector driving circuit 411 outputs at least a photodetection reset signal, a charge accumulation control signal, and an output selection signal which are pulse signals.

The photodetection driver circuit 411 has, for example, at least three shift registers. In this case, the photodetection driver circuit 411 outputs a pulse signal from the first shift register in order to output the photodetection reset signal, outputs a pulse signal from the second shift register in order to output the charge accumulation control signal, and outputs a pulse signal from the third shift register in order to output an output selection signal.

The plurality of photodetector circuits 412 are provided in the row and column directions in a pixel portion Pix of the photodetection portion 401. Note that one or more photodetector circuits 412 form one pixel in the photodetector shown in FIG. 5. The photodetector circuit 412 generates optical data having a potential of a value corresponding to the illuminance of incident light.

A photodetector circuit in the photodetector in Embodiment 1 can be used as the photodetector circuit 412. The photodetector circuit 412 may be provided with a cooling unit, which suppresses occurrence of noise due to heat.

Note that it is also possible to generate the data of a full-color image signal by providing photodetector circuits receiving red light, photodetector circuits receiving green light, and photodetector circuits receiving blue light as the plurality of photodetector circuits 412, generating an optical data signal by these photodetector circuits, and combining the generated data of the optical data signal. In addition to the above-described photodetection circuits, one or more photodetection circuits receiving light of the following colors: cyan, magenta, and yellow may be provided. By providing one or more photodetection circuits receiving light of one or more the following colors: cyan, magenta, and yellow, the number of colors that can be represented in a displayed image based on generated image signals can be increased. For example, by providing a coloring layer, which transmits light of a particular color, in a photodetector circuit and letting light enter the photodetector circuit through the coloring layer, the optical data signal that is a potential having a value corresponding to the illuminance of light of a particular color can be generated.

The data input selection circuit 413 is provided for each column of the photodetector circuits of the pixel portion. An optical data signal is input from the photodetector circuits 412 in the column to the data input selection circuit 413. The data input selection circuit in the photodetector in Embodiment 1 can be used as the data input selection circuit 413.

The difference data generation circuit 414 is provided for each column to be electrically connected to the data input selection circuits 413 in the column of the pixel portion. The difference data generation circuit in Embodiment 1 can be used as the difference data generation circuit 414.

The read circuit 415 is provided in the photodetection portion 401. The read circuit 415 has a function of reading optical data from the photodetector circuit. The read circuit 415 is electrically connected to the output terminal of each difference data generation circuit 414.

The read circuit 415 includes, for example, a selection circuit. For example, the selection circuit includes a transistor and can read data of an optical data signal when the optical data signal is input to the selection circuit in accordance with the behavior of the transistor.

The A/D converter circuit 416 is provided in the photodetection portion 401. The A/D converter circuit 416 has a function of converting analog data which is input from the read circuit 415 into digital data. Note that the A/D converter circuit 416 is not necessarily provided in the photodetection portion 401.

The photodetection control circuit 421 is provided in the control unit 402. The photodetection control circuit 421 has a function of controlling operations of a circuit for a photodetection operation.

The image processing circuit 431 is provided in the data processing unit 403. The image processing circuit 431 has a function of generating image data with the use of an optical data signal generated in the photodetection portion.

Note that the pixel portion may include a display circuit. With such a structure, the photodetector can have a function of a touch panel.

Next, an example of a method for driving the photodetector in FIG. 5 will be described.

The photodetector illustrated in FIG. 5 generates an optical data signal in the photodetector circuit 412. When image capture is implemented in the plurality of photodetector circuits 412 by a global shutter system, distortion of an image to be generated can be suppressed.

Further, with the use of the data input selection circuit 413, an optical data signal of the photodetector circuit 412 in a reset mode is input to a first input terminal of the difference data generation circuit 414, and an optical data signal of the photodetector circuit 412 in a capture mode is input to a second input terminal of the difference data generation circuit 414.

The difference data generation circuit 414 generates difference data.

The difference data is read by the read circuit 415.

The read difference data is converted to digital data by the A/D converter circuit 416. The data is used, for example, by the image processing circuit 431 or the like for a predetermined treatment.

The above are the descriptions of the examples of the methods for driving the photodetector shown in FIG. 5.

As described with reference to FIG. 5, in one example of the photodetector of this embodiment, since difference data is generated for each column, the number of the difference data generation circuits can accordingly be reduced.

In one example of the photodetector of this embodiment, digital difference data is generated by converting analog difference data, whereby the accuracy of removing the amount of change due to noise from the generated data can be higher. Thus, the quality of a captured image can be improved.

Embodiment 4

In this embodiment, examples of electronic devices each including the photodetector described in the above embodiment will be described.

Structure examples of the electronic device of this embodiment will be described with reference to FIGS. 6A and 6B and FIGS. 7A and 7B.

Figure 6A:
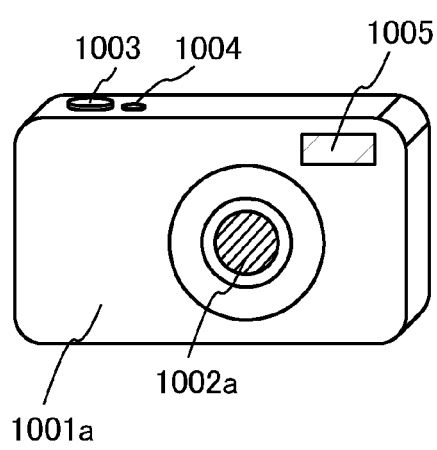
FIGS. 6A and 6B each illustrate an example of an electronic device.

An electronic device illustrated in FIG. 6A is a digital camera. The digital camera illustrated in FIG. 6A includes a housing 1001a, a lens 1002a, a shutter button 1003, a power button 1004, and a flashlight 1005.

Further, the housing 1001a includes a photodetector of the above embodiments. With this structure, incident light is detected by the photodetector through the lens 1002a by pushing the shutter button 1003, so that an image can be taken, for example.

Figure 6B:
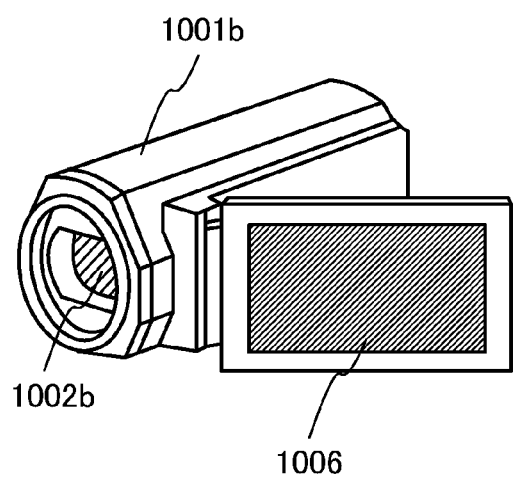

An electronic device illustrated in FIG. 6B is a video camera. The video camera illustrated in FIG. 6B includes a housing 1001b, a lens 1002b, and a display portion 1006.

Further, the housing 1001b includes a photodetector of the above embodiments. With this structure, incident light is detected by the photodetector through the lens 1002b, so that an image can be taken, for example.

Figure 7A:
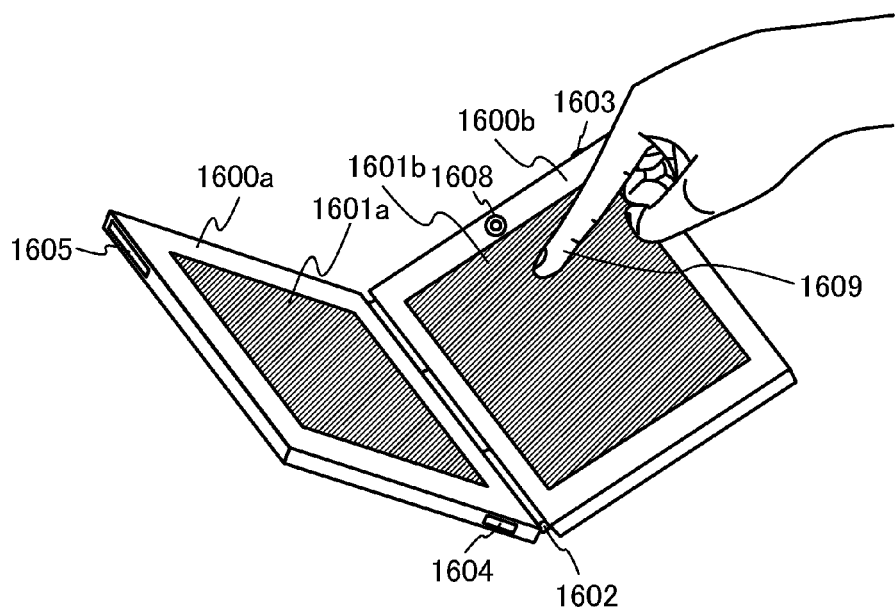
FIGS. 7A and 7B each illustrate an example of an electronic device.
Figure 7B:
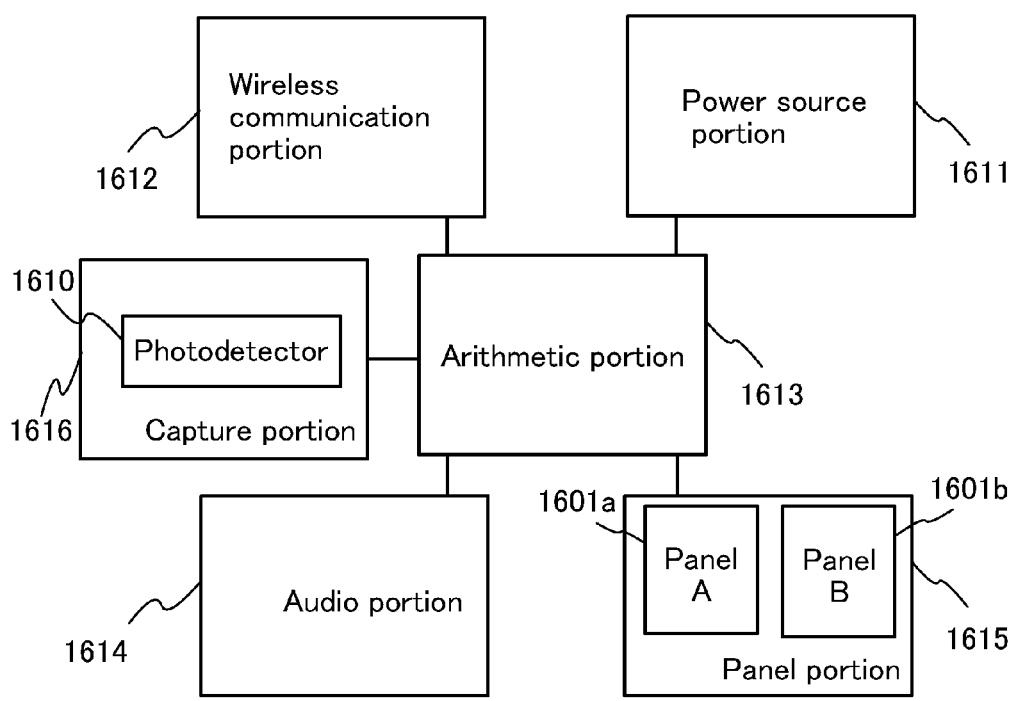

An electronic device illustrated in FIGS. 7A and 7B is an example of a folding information terminal. FIG. 7A is a schematic external view and FIG. 7B is a block diagram.

The electronic device illustrated in FIGS. 7A and 7B includes, as illustrated in FIG. 7A, a housing 1600a, a housing 1600b, a panel 1601a, a panel 1601b, a hinge 1602, a button 1603, a connection terminal 1604, a recording medium insertion portion 1605, and a lens 1608. The electronic device illustrated in FIGS. 7A and 7B also includes, as illustrated in FIG. 7B, a power source portion 1611, a wireless communication portion 1612, an arithmetic portion 1613, an audio portion 1614, a panel portion 1615, and a capture portion 1616.

The panel 1601a is provided for the housing 1600a.

The panel 1601b is provided for the housing 1600b. The housing 1600b is connected to the housing 1600a with the hinge 1602.

The panel 1601a and the panel 1601b each have a function of a display panel. For example, the panel 1601a and the panel 1601b may display different images or one image.

In addition, one or both of the panel 1601a and the panel 1601b may have a faction of a touch panel. In this case, for example, input operations may be performed by touching a keyboard image which is displayed on one or both of the panel 1601a and the panel 1601b, with a finger 1609 or the like. One or both of the panel 1601a and the panel 1601b may be formed by stacking a display panel and a touch panel. One or both of the panel 1601a and the panel 1601b may be formed using an input-output panel including a display circuit and a photodetector circuit.

Since the electronic device illustrated in FIG. 7A has the hinge 1602, the housing 1600a or the housing 1600b can be moved to overlap the housing 1600a with the housing 1600b, for example; that is, the electronic device can fold.

The button 1603 is provided for the housing 1600b. Further or alternatively, the housing 1600a may be provided with the button 1603. Alternatively, the plurality of buttons 1603 may be provided for one or both of the housing 1600a and the housing 1600b. For example, when a power button is provided as the button 1603, the electronic device can be turned on or off by pressing the button 1603.

The connection terminal 1604 is provided for the housing 1600a. Alternatively, the housing 1600b may be provided with the connection terminal 1604. Alternatively, the plurality of connection terminal 1604 may be provided for one or both of the housing 1600a and the housing 1600b. For example, a personal computer is connected to the electronic device through the connection terminal 1604 so that data stored in the electronic device may be rewritten with the personal computer.

The recording medium insertion portion 1605 is provided for the housing 1600a. Alternatively, the housing 1600b may be provided with the recording medium insertion portion 1605. Alternatively, the plurality of recording medium insertion portions 1605 may be provided for one or both of the housing 1600a and the housing 1600b. For example, a card-type recording medium is inserted into the recording medium insertion portion so that data can be read to the electronic device from the card-type recording medium or data stored in the electronic device can be written to the card-type recording medium.

The lens 1608 is provided for the housing 1600b. Further or alternatively, the housing 1600a may be provided with the lens 1608. The plurality of lenses 1608 may be provided for one or both of the housing 1600a and the housing 1600b.

Further, the housing 1600a and the housing 1600b each include the photodetector of the above embodiment. The photodetector detects light coming through the lens 1608, whereby still images and moving images can be taken. Further, the panel 1601a and the panel 1601b may be each provided with the photodetector of the above embodiment. As the photodetector, the photodetector in Embodiment 2 can be used, for example.

The power source portion 1611 has a function of controlling supply of power for driving the electronic device. For example, power is supplied from the power source portion 1611 to the wireless communication portion 1612, the arithmetic portion 1613, the audio portion 1614, and the panel portion 1615. The power source portion 1611 is provided with a power storage device, for example. The power storage device is included in one or both of the housing 1600a and the housing 1600b. Note that a power source circuit with a function of generating a power source voltage for driving the electronic device may be provided for the power source portion 1611. In that case, a power source voltage is generated in the power source circuit by using power supplied from the power storage device. Further or alternatively, the power source portion 1611 may be connected to a commercial power supply.

The wireless communication portion 1612 has a function of transmitting and receiving a radio wave. For example, the wireless communication portion 1612 includes an antenna, a demodulation circuit, a modulation circuit, and the like. In this case, for example, data is exchanged by the antenna by transmission/reception of radio waves to/from the outside. Note that the wireless communication portion 1612 may be provided with a plurality of antennas.

The arithmetic portion 1613 has a function of performing arithmetic processing in accordance with an instruction signal input from the wireless communication portion 1612, the audio portion 1614, the panel portion 1615, and the capture portion 1616, for example. For example, the arithmetic portion 1613 includes CPU, a logic circuit, a memory circuit, and the like.

The audio portion 1614 has a function of controlling input and output of sounds that are audio data. For example, the audio portion 1614 includes a speaker and a microphone.

For example, one or both of the housing 1600a and the housing 1600b include the power source portion 1611, the wireless communication portion 1612, the arithmetic portion 1613, and the audio portion 1614.

The panel portion 1615 has a function of controlling operations of the panel 1601a (also referred to as panel A) and the panel 1601b (also referred to as panel B). Note that the panel portion 1615 may be provided with a driver circuit for controlling driving of the panel 1601a and the panel 1601b to control the operations of the panel 1601a and the panel 1601b.

The capture portion 1616 includes a photodetector 1610. The capture portion 1616 has a function of controlling operation of the photodetector 1610.

Note that one or more of the power source portion 1611, the wireless communication portion 1612, the arithmetic portion 1613, the audio portion 1614, the panel portion 1615, and the capture portion 1616 may be provided with a control circuit so that the operation can be controlled by the control circuit. A control circuit may be provided for the arithmetic portion 1613 to control operation of one or more of the power source portion 1611, the wireless communication portion 1612, the audio portion 1614, the panel portion 1615, and the capture portion 1616.

One or more of the power source portion 1611, the wireless communication portion 1612, the audio portion 1614, the panel portion 1615, and the capture portion 1616 may be provided with a memory circuit so that needed data is stored in the memory circuit in operation. Thus, operation rate can be increased.

The electronic device illustrated in FIGS. 7A and 7B can be supplied with power from a commercial power supply and also use power accumulated in a power storage device. Accordingly, even when there is no supply of power from the commercial power supply because of a power failure or the like, for example, the electronic device can be driven by using the power storage device as a power source.

With the structure illustrated in FIGS. 7A and 7B, the electronic device illustrated in FIGS. 7A and 7B can have a function of one or more of a telephone set, an e-book reader, a personal computer, and a game machine, for example.

As described with reference to FIGS. 6A and 6B and FIGS. 7A and 7B, in the examples of the electronic devices according to this embodiment, the photodetectors in the above embodiments can be used. With the use of the photodetector, an electronic device which is capable of capturing an image with high accuracy can be provided.

Example 1

In this example, a photodetector that was actually fabricated will be described.

A photodetector in this example includes a plurality of photodetector circuits that are arranged in row and column directions, a plurality of difference data generation circuits to which optical data signals of photodetector circuits in each column are input, and a plurality of data input selection circuits for controlling the potential of an input terminal of each difference data generation circuit. Note that the number of rows of the photodetector circuits is 150.

Further, the circuit configuration of the photodetector including photodetector circuits in the n-th row (n is a natural number of two or more) will be described with reference to FIGS. 8A and 8B.

Figure 8A:
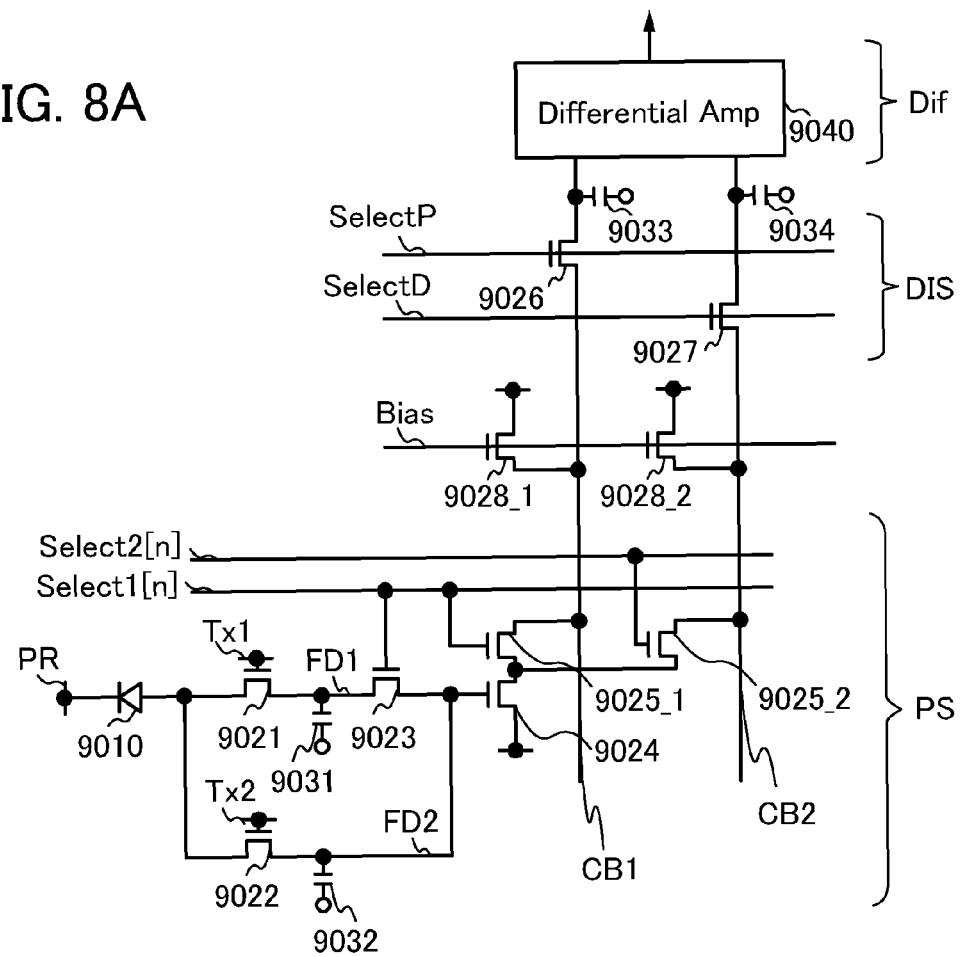
FIGS. 8A and 8B illustrate an example of a photodetector.

The photodetector illustrated in FIG. 8A includes the photodetector circuit PS, the difference data generation circuit Dif, the data input selection circuit DIS, a column bus CB1, a column bus CB2, a field-effect transistor 9028_1, and a field-effect transistor 9028_2.

The photodetector circuit PS includes a photodiode 9010, field-effect transistors 9021 to 9024, a capacitor 9031, the capacitor 9032, a field-effect transistor 9025_1, and a field-effect transistor 9025_2.

A cathode of the photodiode 9010 is connected to the photodetection reset signal line PR.

One of a source and a drain of the field-effect transistor 9021 is connected to an anode of the photodiode 9010. A gate of the field-effect transistor 9021 is connected to the first charge transmission control signal line TX1.

One of a source and a drain of the field-effect transistor 9022 is connected to the anode of the photodiode 9010. A gate of the field-effect transistor 9022 is connected to the second charge transmission control signal line TX2.

One of a pair of electrodes of the capacitor 9031 is connected to the other of the source and the drain of the field-effect transistor 9021. A ground potential is supplied to the other of the pair of electrodes of the capacitor 9031.

One of a pair of electrodes of the capacitor 9032 is connected to the other of the source and the drain of the field-effect transistor 9022. A ground potential is supplied to the other of the pair of electrodes of the capacitor 9032.

One of a source and a drain of the field-effect transistor 9023 is connected to the other of the source and the drain of the field-effect transistor 9021. A gate of the field-effect transistor 9023 is connected to the data input selection signal line Select1[n].

A potential Vpi is supplied to one of a source and a drain of the field-effect transistor 9024. A gate of the field-effect transistor 9024 is connected to the other of the source and the drain of the field-effect transistor 9022 and the other of the source and the drain of the field-effect transistor 9023.

One of a source and a drain of the field-effect transistor 9025_1 is connected to the other of the source and the drain of the field-effect transistor 9024. The other of the source and the drain of the field-effect transistor 9025_1 is connected to the column bus CB1. A gate of the field-effect transistor 9025_1 is connected to the data input selection signal line Select1[n].

One of a source and a drain of the field-effect transistor 9025_2 is connected to the other of the source and the drain of the field-effect transistor 9024. The other of the source and the drain of the field-effect transistor 9025_2 is connected to the column bus CB2. A gate of the field-effect transistor 9025_2 is connected to the data input selection signal line Select2[n].

The difference data generation circuit Dif includes a differential amplifier (also referred to as Differential Amp) 9040.

The data input selection circuit DIS includes a field-effect transistor 9026 and a field-effect transistor 9027.

One of a source and a drain of the field-effect transistor 9026 is connected to the column bus CB1. The other of the source and the drain of the field-effect transistor 9026 is electrically connected to a negative input terminal of the differential amplifier 9040 in the difference data generation circuit Dif. A gate of the field-effect transistor 9026 is connected to a data input selection signal line SelectP.

One of a source and a drain of the field-effect transistor 9027 is connected to the column bus CB2. The other of the source and the drain of the field-effect transistor 9027 is electrically connected to a positive input terminal of the differential amplifier 9040 in the difference data generation circuit Dif. A gate of the field-effect transistor 9027 is connected to a data input selection signal line SelectD.

A potential Vp0 is supplied to one of a source and a drain of the field-effect transistor 9028_1. The other of the source and the drain of the field-effect transistor 9028_1 is connected to the column bus CB1. A gate of the field-effect transistor 9028_1 is connected to a voltage supply line Bias.

The potential Vp0 is supplied to one of a source and a drain of the field-effect transistor 9028_2. The other of the source and the drain of the field-effect transistor 9028_2 is connected to the column bus CB2. A gate of the field-effect transistor 9028_2 is connected to the voltage supply line Bias.

A capacitor 9033 and a capacitor 9034 are parasitic capacitance.

Next, a method for driving the photodetector of this example will be described with reference to a timing chart in FIG. 8B.

Figure 8B:
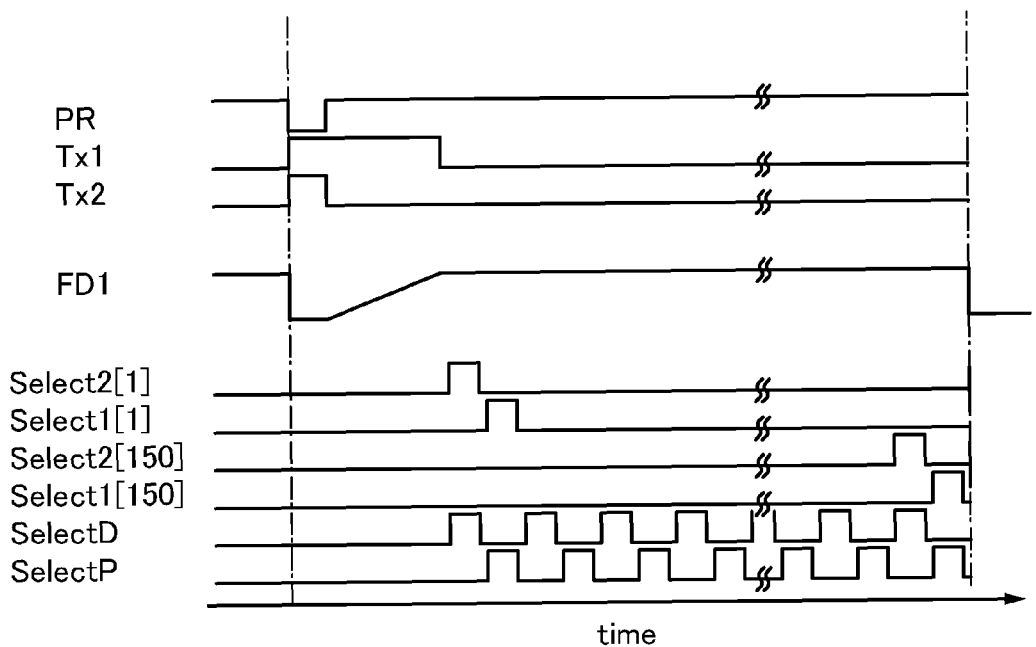

As illustrated in FIG. 8B, a pulse of the photodetection reset signal line PR, a pulse of the first charge transmission control signal line TX1, and a pulse of the second charge transmission control signal line TX2 are input so that the photodetector circuit PS becomes a reset mode.

Next, the field-effect transistor 9022 is turned off by the pulse of the second charge transmission control signal line TX2, so that charge of the node FD2 is held.

The field-effect transistor 9021 is turned off by the pulse of the first charge transmission control signal line TX1, so that charge of the node FD1 is held.

The above operation is performed on every photodetector circuit.

Next, a pulse of a data input selection signal line Select2[K (K is a natural number of 1 or more and 150 or less)] is input, whereby an optical data signal is output to the column bus CB2. Data of the optical data signal is data when the photodetector circuit PS is in a reset mode.

Then, a pulse of a data input selection signal line Select1[K (K is a natural number of 1 or more and 150 or less)] is input, whereby an optical data signal is output to the column bus CB1. Data of the optical data signal is data when the photodetector circuit PS is in a capture mode.

By a pulse of the data input selection signal line SelectP, an optical data signal input through the column bus CB1 is output to the differential amplifier 9040 in the difference data generation circuit Dif. By a pulse of the data input selection signal line SelectD, an optical data signal input through the column bus CB2 is output to the differential amplifier 9040 in the difference data generation circuit Dif.

The differential amplifier 9040 in the difference data generation circuit Dif generates difference data of data of the optical data signal input through the column bus CB1 and data of the optical data signal input through the column bus CB2 and outputs the difference data to an A/D converter as an output signal.

The above is the method for driving the photodetector in this example.

Figure 9A:
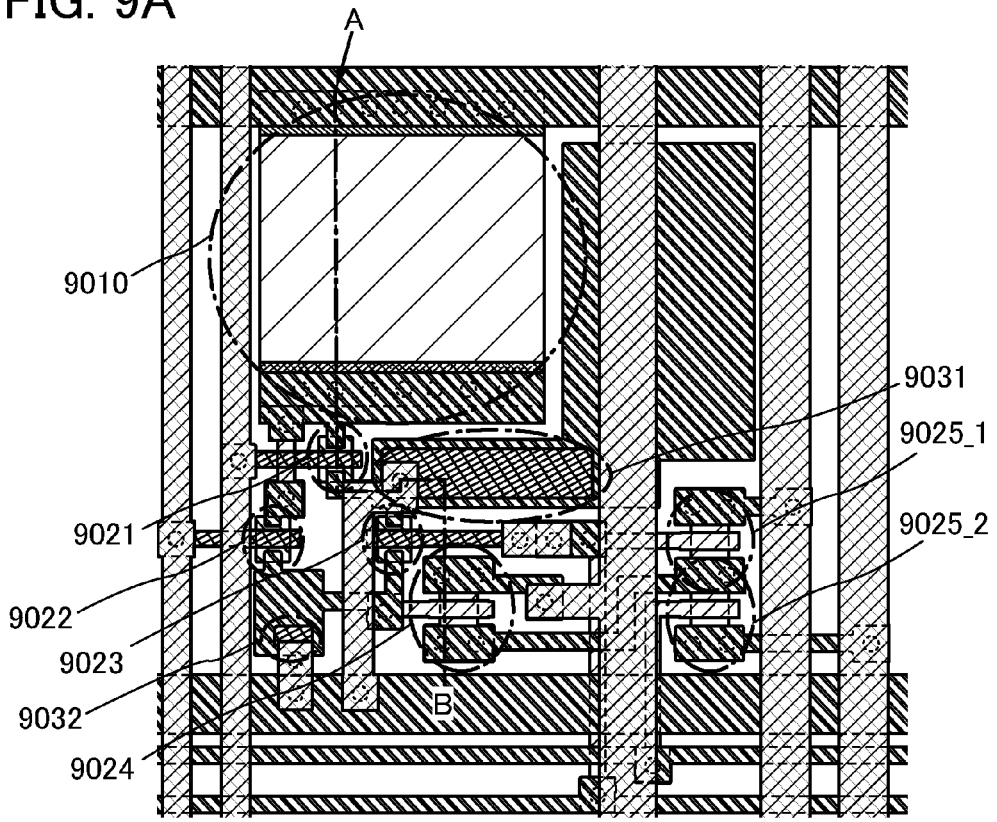
FIGS. 9A and 9B illustrate an example of a photodetector.
Figure 9B:
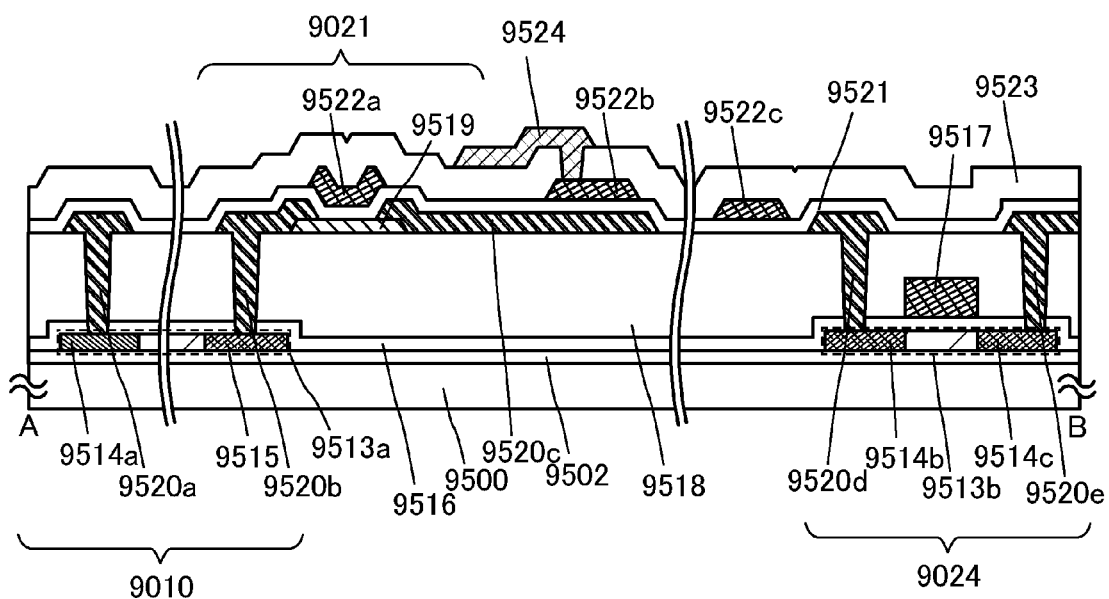

Next, a structure of the photodetector circuit in the photodetector illustrated in FIG. 8A will be described with reference to FIGS. 9A and 9B. FIG. 9A is a schematic plan view and FIG. 9B is a schematic cross-sectional view taken along line A-B in FIG. 9A. Note that the components illustrated in FIGS. 9A and 9B include those having sizes different from the actual sizes. For convenience, in FIG. 9B, part of cross section along line A-B of FIG. 9A is not shown.

The photodetector circuit illustrated in FIGS. 9A and 9B includes the photodiode 9010, the field-effect transistor 9021, the field-effect transistor 9022, the capacitor 9031, the capacitor 9032, the field-effect transistor 9023, the field-effect transistor 9024, the field-effect transistor 9025_1, and the field-effect transistor 9025_2.

The field-effect transistors 9021 to 9023 are n-channel transistors each including an oxide semiconductor layer in which a channel is formed. The field-effect transistor 9024, the field-effect transistor 9025_1, and the field-effect transistor 9025_2 are n-channel transistors each including a silicon semiconductor layer in which a channel is formed. The photodiode 9010 is a lateral PIN junction diode including a silicon semiconductor layer.

As illustrated in FIG. 9B, the photodetector circuit includes a semiconductor layer 9513a, a semiconductor layer 9513b, an insulating layer 9516, a conductive layer 9517, an insulating layer 9518, an oxide semiconductor layer 9519, conductive layers 9520a to 9520e, an insulating layer 9521, conductive layers 9522a to 9522c, an insulating layer 9523, and a conductive layer 9524.

The semiconductor layer 9513a and the semiconductor layer 9513b are provided over a substrate 9500 with an insulating layer 9502 laid therebetween.

A single crystal silicon substrate was used as the substrate 9500.

As the insulating layer 9502, a stacked layer of a 400-nm-thick silicon oxide layer, a 50-nm-thick silicon nitride oxide layer, and a 100-nm-thick silicon oxide layer was used.

The semiconductor layer 9513a includes an N-type region 9514a and a P-type region 9515.

The semiconductor layer 9513b includes an N-type region 9514b and an N-type region 9514c.

As the semiconductor layer 9513b, a 130-nm-thick single crystal silicon layer was used. As the semiconductor layer 9513a, a 60-nm-thick single crystal silicon layer which is formed by etching of a 130-nm-thick single crystal silicon layer was used.

The insulating layer 9516 is provided over the semiconductor layer 9513a and the semiconductor layer 9513b. A 20-nm-thick silicon oxide layer was used as the insulating layer 9516.

The conductive layer 9517 is formed over the semiconductor layer 9513b with the insulating layer 9516 laid therebetween. As the conductive layer 9517, a stacked layer of a 30-nm-thick tantalum nitride layer and a 170-nm-thick tungsten layer was used.

The insulating layer 9518 is provided over the insulating layer 9516 and the conductive layer 9517. As the insulating layer 9518, a stacked layer of a 50-nm-thick silicon oxynitride layer and a 500-nm-thick silicon oxide layer was used.

The oxide semiconductor layer 9519 is provided over the insulating layer 9518. As the oxide semiconductor layer 9519, a 20-nm-thick IGZO layer was used.

The conductive layer 9520a is in contact with the N-type region 9514a of the semiconductor layer 9513a through an opening penetrating the insulating layer 9516 and the insulating layer 9518.

The conductive layer 9520b is in contact with the P-type region 9515 of the semiconductor layer 9513a through an opening penetrating the insulating layer 9516 and the insulating layer 9518. The conductive layer 9520b is also in contact with the oxide semiconductor layer 9519.

The conductive layer 9520c is in contact with the oxide semiconductor layer 9519.

The conductive layer 9520d is in contact with the N-type region 9514b of the semiconductor layer 9513b through an opening penetrating the insulating layer 9516 and the insulating layer 9518.

The conductive layer 9520e is in contact with the N-type region 9514c of the semiconductor layer 9513b through an opening penetrating the insulating layer 9516 and the insulating layer 9518.

As each of the conductive layers 9520a to 9520e, a 100-nm-thick tungsten layer was used.

The insulating layer 9521 is provided over the insulating layer 9518, the oxide semiconductor layer 9519, and the conductive layers 9520a to 9520e.

As the insulating layer 9521, a 30-nm-thick silicon oxynitride layer was used.

The conductive layer 9522a is provided over the oxide semiconductor layer 9519 with the insulating layer 9521 laid therebetween.

The conductive layer 9522b overlaps with the conductive layer 9520c with the insulating layer 9521 laid therebetween.

The conductive layer 9522c is provided over the insulating layer 9521.

As each of the conductive layers 9522a to 9522c, a stacked layer of a 30-nm-thick tantalum nitride layer and a 135-nm-thick tungsten layer was used.

The insulating layer 9523 is provided over the insulating layer 9521 and the conductive layers 9522a to 9522c.

As the insulating layer 9523, a stacked layer of a 50-nm-thick aluminum oxide layer and a 300-nm-thick silicon oxynitride layer was used.

The conductive layer 9524 is in contact with the conductive layer 9522*b* through an opening penetrating the insulating layer 9523.

As the conductive layer 9524, a stacked layer of a 50-nm-thick titanium layer, a 200-nm-thick aluminum layer, and a 50-nm-thick titanium layer was used.

A field-effect transistor including an oxide semiconductor layer (e.g., the field-effect transistor 9021) is provided over the photodiode 9010 and a field-effect transistor including a silicon semiconductor layer (e.g., the field-effect transistor 9024). Thus, an increase in area can be prevented.

The above is description of the structure of the photodetector circuit in the photodetector illustrated in FIG. 8A.

As described with reference to FIGS. 8A and 8B and FIGS. 9A and 9B, in the photodetector of this example, the photodetector of the above embodiments was able to be formed, in which a photodiode and a field-effect transistor are formed using a silicon semiconductor layer and further a field-effect transistor is formed using an oxide semiconductor layer over the silicon semiconductor layer.

EXPLANATION OF REFERENCE

110: photoelectric conversion element; 121: field-effect transistor; 122: field-effect transistor; 123: field-effect transistor; 124: field-effect transistor; 125: field-effect transistor; 125_1: field-effect transistor; 125_2: field-effect transistor; 126: field-effect transistor; 127: field-effect transistor; 128: field-effect transistor; 131: capacitor; 132: capacitor; 140: differential amplifier; 401: photodetection portion; 402: control unit; 403: data processing unit; 411: photodetection driver circuit; 412: photodetector circuit; 413: data input selection circuit; 414: difference data generation circuit; 415: read circuit; 416: A/D converter circuit; 421: photodetection control circuit; 431: image processing circuit; 1001*a*: housing; 1001*b*: housing; 1002*a*: lens; 1002*b*: lens; 1003: shutter button; 1004: power button; 1005: flashlight; 1006: display portion; 1600*a*: housing; 1600*b*: housing; 1601*a*: panel; 1601*b*: panel; 1602: hinge; 1603: button; 1604: connection terminal; 1605: recording medium insertion portion; 1608: lens; 1609: finger; 1610: photodetector; 1611: power source portion; 1612: wireless communication portion; 1613: arithmetic portion; 1614: audio portion; 1615: panel portion; 1616: capture portion; 9010: photodiode; 9021: field-effect transistor; 9022: field-effect transistor; 9023: field-effect transistor; 9024: field-effect transistor; 9025_1: field-effect transistor; 9025_2: field-effect transistor; 9026: field-effect transistor; 9027: field-effect transistor; 9028_1: field-effect transistor; 9028_2: field-effect transistor; 9031: capacitor; 9032: capacitor; 9033: capacitor; 9034: capacitor; 9040: differential amplifier; 9500: substrate; 9502: insulating layer; 9513*a*: semiconductor layer; 9513*b*: semiconductor layer; 9514*a*: N-type region; 9514*b*: N-type region; 9514*c*: N-type region; 9515: P-type region; 9516: insulating layer; 9517: conductive layer; 9518: insulating layer; 9519: oxide semiconductor layer; 9520*a*: conductive layer; 9520*b*: conductive layer; 9520*c*: conductive layer; 9520*d*: conductive layer; 9520*e*: conductive layer; 9521: insulating layer; 9522*a*: conductive layer; 9522*b*: conductive layer; 9522*c*: conductive layer; 9523: insulating layer; 9524: conductive layer This application is based on Japanese Patent Application serial no. 2011-206899 filed with Japan Patent Office on Sep. 22, 2011, the entire contents of which are hereby incorporated by reference.

The invention claimed is:

1. A photodetector comprising:
a photoelectric conversion element;
a difference data generation circuit comprising a differential amplifier;
a data bus;
a switch electrically connected to the data bus;
a first transistor;
a second transistor;
a third transistor;
a fourth transistor; and
a data input selection circuit comprising:
a fifth transistor; and
a sixth transistor,
wherein one of a source and a drain of the first transistor is electrically connected to the photoelectric conversion element,
wherein one of a source and a drain of the second transistor is electrically connected to the photoelectric conversion element,
wherein the other of the source and the drain of the first transistor is electrically connected to the other of the source and the drain of the second transistor,
wherein the other of the source and the drain of the second transistor is electrically connected to a gate of the third transistor,
wherein one of a source and a drain of the third transistor is electrically connected to one of a source and a drain of the fourth transistor,
wherein the other of the source and the drain of the fourth transistor is electrically connected to the data bus,
wherein one of a source and a drain of the fifth transistor is electrically connected to the data bus,
wherein one of a source and a drain of the sixth transistor is electrically connected to the data bus,
wherein the other of the source and the drain of the fifth transistor is electrically connected to a first input terminal of the differential amplifier, and
wherein the other of the source and the drain of the sixth transistor is electrically connected to a second input terminal of the differential amplifier.

2. The photodetector according to claim 1, further comprising:
a first capacitor;
a second capacitor; and
a seventh transistor,
wherein an electrode of the first capacitor is electrically connected to the other of the source and the drain of the first transistor,
wherein an electrode of the second capacitor is electrically connected to the other of the source and the drain of the second transistor, and
wherein the other of the source and the drain of the first transistor is electrically connected to the other of the source and the drain of the second transistor through the seventh transistor.

3. The photodetector according to claim 1, further comprising:
a first capacitor;
a second capacitor; and
a seventh transistor, wherein an electrode of the first capacitor is electrically connected to the other of the source and the drain of the first transistor, wherein one of a source and a drain of the seventh transistor is electrically connected to the second input terminal of the differential amplifier, and wherein the other of the source and the drain of the seventh transistor is electrically connected to an electrode of the second capacitor.

4. The photodetector according to claim 1,
wherein the first transistor comprises an oxide semiconductor layer comprising a channel formation region.

5. A photodetector comprising:
a photoelectric conversion element;
a difference data generation circuit comprising a differential amplifier;
a first data bus;
a second data bus;
a first switch electrically connected to the first data bus;
a second switch electrically connected to the second data bus;
a first transistor;
a second transistor;
a third transistor;
a fourth transistor;
a data input selection circuit comprising:
 a fifth transistor; and
 a sixth transistor; and
a seventh transistor,
wherein one of a source and a drain of the first transistor is electrically connected to the photoelectric conversion element,
wherein one of a source and a drain of the second transistor is electrically connected to the photoelectric conversion element,
wherein the other of the source and the drain of the first transistor is electrically connected to the other of the source and the drain of the second transistor,
wherein the other of the source and the drain of the second transistor is electrically connected to a gate of the third transistor,
wherein one of a source and a drain of the third transistor is electrically connected to one of a source and a drain of the fourth transistor,
wherein the other of the source and the drain of the fourth transistor is electrically connected to the first data bus,
wherein one of a source and a drain of the fifth transistor is electrically connected to the first data bus,
wherein one of a source and a drain of the sixth transistor is electrically connected to the second data bus,
wherein the other of the source and the drain of the fifth transistor is electrically connected to a first input terminal of the differential amplifier,
wherein the other of the source and the drain of the sixth transistor is electrically connected to a second input terminal of the differential amplifier,
wherein one of a source and a drain of the seventh transistor is electrically connected to the one of the source and the drain of the third transistor, and
wherein the other of the source and the drain of the seventh transistor is electrically connected to the second data bus.

6. The photodetector according to claim 5, further comprising:
a first capacitor;
a second capacitor; and
an eighth transistor,
wherein an electrode of the first capacitor is electrically connected to the other of the source and the drain of the first transistor,
wherein an electrode of the second capacitor is electrically connected to the other of the source and the drain of the second transistor, and
wherein the other of the source and the drain of the first transistor is electrically connected to the other of the source and the drain of the second transistor through the eighth transistor.

7. The photodetector according to claim 5, further comprising:
a first capacitor;
a second capacitor; and
an eighth transistor,
wherein an electrode of the first capacitor is electrically connected to the other of the source and the drain of the first transistor,
wherein one of a source and a drain of the eighth transistor is electrically connected to the second input terminal of the differential amplifier, and
wherein the other of the source and the drain of the eighth transistor is electrically connected to an electrode of the second capacitor.

8. The photodetector according to claim 5,
wherein the first transistor comprises an oxide semiconductor layer comprising a channel formation region.

* * * * *